US009113575B2

(12) United States Patent
Shimizu

(10) Patent No.: US 9,113,575 B2
(45) Date of Patent: Aug. 18, 2015

(54) WIRING BOARD WITH BUILT-IN ELECTRONIC COMPONENT AND METHOD FOR MANUFACTURING THE SAME

(75) Inventor: Keisuke Shimizu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 214 days.

(21) Appl. No.: 13/414,899

(22) Filed: Mar. 8, 2012

(65) Prior Publication Data

US 2012/0241205 A1    Sep. 27, 2012

Related U.S. Application Data

(60) Provisional application No. 61/466,600, filed on Mar. 23, 2011.

(51) Int. Cl.
| | |
|---|---|
| *H05K 1/16* | (2006.01) |
| *H05K 1/18* | (2006.01) |
| *H01L 23/00* | (2006.01) |
| *H05K 3/30* | (2006.01) |
| *H05K 3/46* | (2006.01) |

(52) U.S. Cl.
CPC .............. *H05K 1/188* (2013.01); *H01L 24/18* (2013.01); *H01L 2924/07802* (2013.01); *H05K 3/305* (2013.01); *H05K 3/4661* (2013.01); *H05K 3/4697* (2013.01); *Y10T 29/49124* (2015.01)

(58) Field of Classification Search
USPC ................. 174/260, 250, 255–259, 261, 262
See application file for complete search history.

(56) References Cited

U.S. PATENT DOCUMENTS

| | | |
|---|---|---|
| 2010/0155124 A1 | 6/2010 | Kawamura et al. |
| 2010/0212946 A1 | 8/2010 | Shimizu et al. |
| 2010/0214752 A1 | 8/2010 | Shimizu et al. |
| 2010/0224397 A1 | 9/2010 | Shimizu et al. |
| 2010/0300602 A1* | 12/2010 | Ichiyanagi et al. ........ 156/89.12 |

FOREIGN PATENT DOCUMENTS

| | | |
|---|---|---|
| CN | 101102642 A | 1/2008 |
| CN | 101395978 A | 3/2009 |
| CN | 101946568 A | 1/2011 |
| JP | 2003-309373 | 10/2003 |
| JP | 2004-527908 A | 9/2004 |
| JP | 2010-129992 A | 6/2010 |
| JP | 2010-212652 A | 9/2010 |
| WO | WO 2008/155967 | 12/2008 |

OTHER PUBLICATIONS

U.S. Appl. No. 13/273,532, filed Oct. 14, 2011, Shimizu, et al.

* cited by examiner

*Primary Examiner* — Tremesha S Willis
(74) *Attorney, Agent, or Firm* — Oblon, McClelland, Maier & Neustadt, L.L.P.

(57) ABSTRACT

A wiring board with a built-in electronic component includes a substrate having an accommodation portion, an electronic component having an electrode and accommodated in the accommodation portion of the substrate, a conductive layer having a planar conductive pattern formed over the electrode of the electronic component, and one or more via conductors connecting the planar conductive pattern of the conductive layer and the electrode of the electronic component. The electrode of the electronic component has a portion which faces the planar conductive pattern of the conductive layer and which has a plurality of outer edges facing outward with respect to a surface of the electronic component on which the portion of the electrode is formed, and the planar conductive pattern of the conductive layer has a portion positioned directly over one or more of the outer edges of the electrode of the electronic component.

20 Claims, 21 Drawing Sheets

WIRING BOARD WITH BUILT-IN ELECTRONIC COMPONENT AND METHOD FOR MANUFACTURING THE SAME

CROSS-REFERENCE TO RELATED APPLICATIONS

The present application is based on and claims the benefit of priority to U.S. application Ser. No. 61/466,600, filed Mar. 23, 2011, the entire contents of which are incorporated herein by reference.

BACKGROUND OF THE INVENTION

1. Field of the Invention

The present invention relates to a wiring board with a built-in electronic component and a method for manufacturing such a wiring board.

2. Discussion of the Background

International Publication No. 2008/155967 and Japanese Laid-Open Patent Publication No. 2003-309373 describe a wiring board with a built-in electronic component having the following: an electronic component with an electrode, an insulation layer formed on the electronic component, a via conductor made by forming a conductor in a via hole formed in the insulation layer, and a conductive layer electrically connected to the electrode of the electronic component by the via conductor. The contents of International Publication No. 2008/155967 and Japanese Laid-Open Patent Publication No. 2003-309373 are incorporated herein by reference in their entirety in this application.

SUMMARY OF THE INVENTION

According to one aspect of the present invention, a wiring board with a built-in electronic component includes a substrate having an accommodation portion, an electronic component having an electrode and accommodated in the accommodation portion of the substrate, a conductive layer having a planar conductive pattern formed over the electrode of the electronic component, and one or more via conductors connecting the planar conductive pattern of the conductive layer and the electrode of the electronic component. The electrode of the electronic component has a portion which faces the planar conductive pattern of the conductive layer and which has outer edges facing outward with respect to a surface of the electronic component on which the portion of the electrode is formed, and the planar conductive pattern of the conductive layer has a portion positioned directly over one or more of the outer edges of the electrode of the electronic component.

According to another aspect of the present invention, a method for manufacturing a wiring board with a built-in electronic component includes forming an insulation layer on an electronic component having an electrode such that the insulation layer covers the electrode of the electronic component, forming a via hole through the insulation layer such that the via hole extends to the electrode of the electronic component, forming a via conductor in the via hole such that the via conductor is connected to the electrode of the electronic component, and forming over the insulation layer a conductive layer having a planar conductive pattern such that the planar conductive pattern is formed over the electrode of the electronic component. The electrode of the electronic component has a portion which faces the planar conductive pattern of the conductive layer and which has outer edges facing outward with respect to a surface of the electronic component on which the portion of the electrode is formed, and the planar conductive pattern of the conductive layer has a portion positioned directly over at least one of the outer edges of the electrode of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
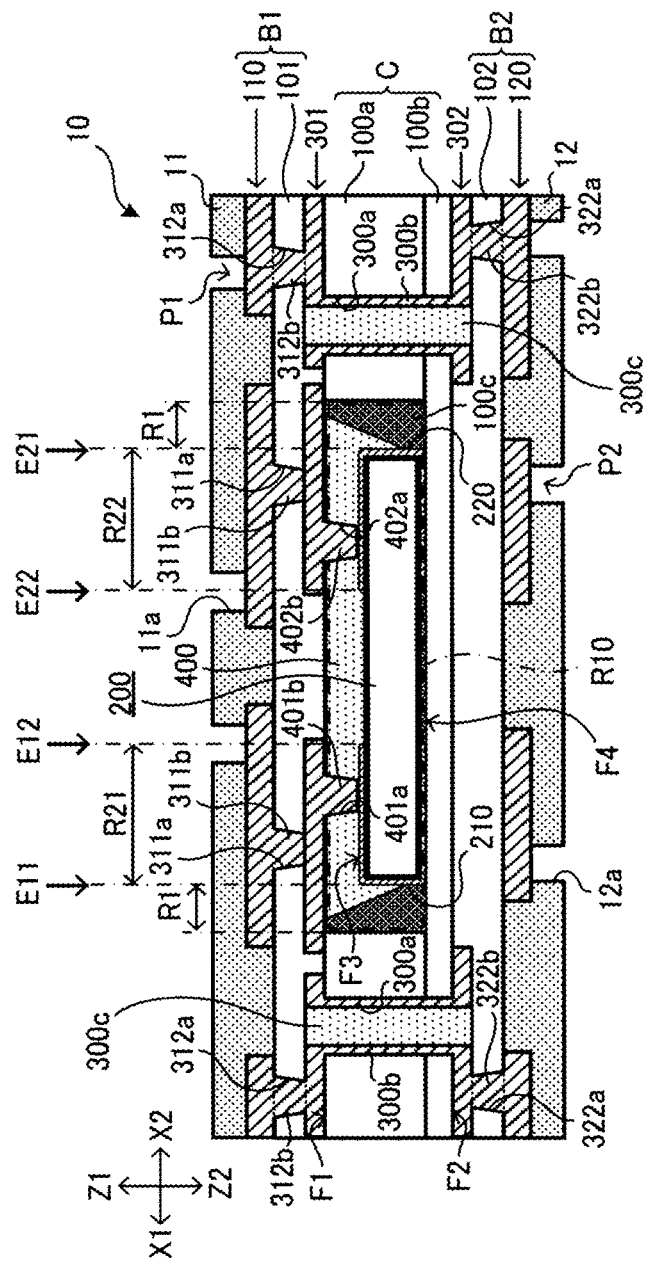
FIG. 1 is a cross-sectional view of a wiring board with a built-in electronic component according to a first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board corresponding to a direction along a normal line (or a direction of the thickness of the wiring board) to the main surfaces (upper and lower surfaces) of the wiring board. On the other hand, arrows (X1, X2) and (Y1, Y2) each indicate a direction perpendicular to a lamination direction (or directions to the sides of each layer). The main surfaces of the wiring board are on the X-Y plane. Side surfaces of the wiring board are on the X-Z plane or the Y-Z plane.

Two main surfaces facing opposite directions along a normal line are referred to as a first surface or a third surface (a surface on the Z1 side) and as a second surface or a fourth surface (a surface on the Z2 side). In a lamination direction, a side closer to the core is referred to as a lower layer (or an inner-layer side), and a side farther from the core is referred to as an upper layer (or an outer-layer side). Also, on the X-Y plane, a side farther from an electronic component (in particular, its gravity center) is referred to as an outer side, and the side closer to the electronic component is referred to as an inner side. "Directly on" indicates along a direction Z (the Z1 side or the Z2 side). A planar shape means a shape on the X-Y plane unless otherwise specified.

A conductive layer is a layer formed by one or more conductive patterns. Conductive layers may include a conductive pattern for forming a conductive circuit, such as wiring (including ground), a pad, a land or the like, or it may include a planar conductive pattern that does not form an electrical circuit (hereinafter referred to as a plain pattern).

Opening portions include a notch, a cut or the like other than a hole or a groove. Holes are not limited to penetrating holes, but include non-penetrating holes. Holes include via holes and through holes. Hereinafter, the conductor formed in a via hole (wall surface or bottom surface) is referred to as a via conductor, and the conductor formed in a through hole (wall surface) is referred to as a through-hole conductor.

Plating includes wet plating such as electrolytic plating as well as dry plating such as PVD (physical vapor deposition) and CVD (chemical vapor deposition).

"Preparing" includes situations in which material and components are purchased and manufactured accordingly as well as situations in which finished products are purchased and used accordingly.

Positioning an electronic component in an opening portion includes accommodating the entire electronic component completely in the opening portion as well as positioning only part of the electronic component in the opening portion.

First Embodiment

As shown in FIG. 1, wiring board 10 according to the present embodiment has core section (C), first buildup section (B1), second buildup section (B2), electronic component 200 and solder resists (11, 12). Wiring board 10 is a wiring board with a built-in electronic component, and is made of a rectangular rigid wiring board, for example. However, wiring board 10 is not limited to the above, and it may also be a flexible wiring board. Hereinafter, one of the upper and lower surfaces (two main surfaces) of core section (C) is referred to as first surface (F1) and the other as second surface (F2). Also, among the upper and lower surfaces (two main surfaces) of electronic component 200, the surface facing the same direction as first surface (F1) is referred to as third surface (F3), and the other as fourth surface (F4).

Core section (C) is formed with insulation layers (100a, 100b) and through-hole conductor (300b). A penetrating hole is formed in insulation layer (100a), and insulation layer (100b) covers an opening on one side of the penetrating hole. Accordingly, cavity (R10) made of the hole that penetrates through insulation layer (100a) is formed in core section (C). Cavity (R10) corresponds to an opening portion in which electronic component 200 is accommodated.

Conductive layer 301 and first buildup section (B1) are formed on first surface (F1) of core section (C), and conductive layer 302 and second buildup section (B2) are formed on second surface (F2) of core section (C). First buildup section (B1) is formed with insulation layer 101 (interlayer insulation layer) and conductive layer 110; and second buildup section (B2) is formed with insulation layer 102 (interlayer insulation layer) and conductive layer 120. Electronic component 200 is built into wiring board 10. Solder resists (11, 12) are formed on first buildup section (B1) and second buildup section (B2) respectively.

Through hole (300a) is formed in core section (C), and through-hole conductor (300b) (conformal conductor) is formed by forming a conductor (such as copper plating) on the wall surface of through hole (300a). In addition, insulative body (300c) is filled inside through-hole conductor (300b) in through hole (300a). Conductive layer 301 on first surface (F1) of core section (C) and conductive layer 302 on second surface (F2) of core section (C) are electrically connected to each other by through-hole conductor (300b). In the present embodiment, through hole (300a) is shaped substantially as a column. Namely, through hole (300a) has substantially a constant width. In the present embodiment, insulative body (300c) is made of insulative material (in particular, resin) that forms upper insulation layer 101 (in particular, a resin insulation layer). However, insulative body (300c) is not limited to the above, and it may be made of any insulative material prepared separately.

Electronic component 200 is positioned to a side of insulation layer (100a) (in a direction X or direction Y) by being arranged in cavity (R10). In the present embodiment, substantially the entire electronic component 200 is completely accommodated in cavity (R10). However, the present embodiment is not limited to such and only part of electronic component 200 may be arranged in cavity (R10). In the present embodiment, third surface (F3) of electronic component 200 is covered by adhesive layer 400. In addition, adhesive layer 400 and insulative body (100c) are filled in gap (R1) between electronic component 200 and insulation layer (100a) in cavity (R10). In the present embodiment, the surface of electronic component 200 is completely covered by adhesive layer 400 and insulative body (100c). Accordingly, electronic component 200 is protected by adhesive layer 400 and insulative body (100c) as well as being fixed to a predetermined location.

In the present embodiment, adhesive layer 400 is made of insulative adhesive material such as NCP (nonconductive liquid polymer). Namely, in the present embodiment, an insulation layer (adhesive layer 400) made of adhesive material is formed on electronic component 200. Adhesive layer 400 is used to temporarily fix electronic component 200 on a carrier (support material) during the manufacturing process, for example (see FIGS. 6C and 6D).

Figure 9:
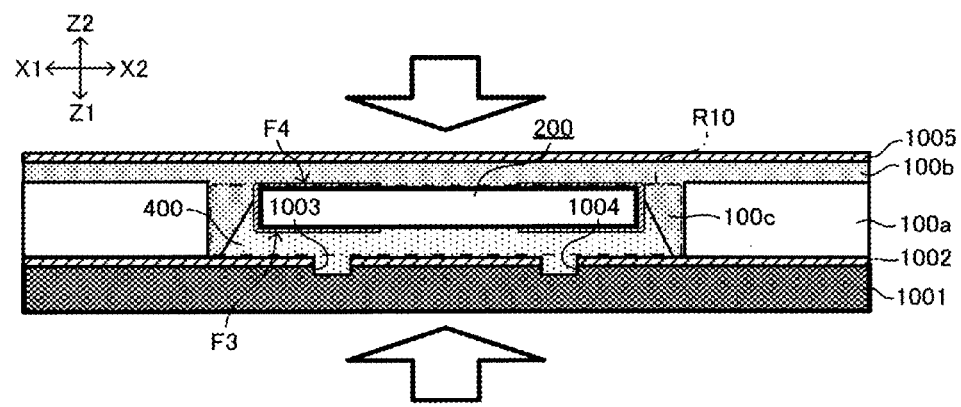
FIG. 9 is a view to illustrate a second step for forming the core section in the manufacturing method shown in FIG. 5.

In the present embodiment, insulative body (100c) is made of insulative material (in particular, resin) that forms insulation layer (100b) (in particular, resin insulation layer) of core section (C) (see FIG. 9). However, the material for insulative body (100c) is not limited to such, and it may be any other insulative material prepared separately.

Insulation layer 101 is formed on first surface (F1) of core section (C), and insulation layer 102 is formed on second surface (F2) of core section (C). Then, of the openings of cavity (R10) (hole), the opening on the side which is not covered by insulation layer (100b) is covered by insulation layer 101.

Conductive layer 110 is formed on insulation layer 101, and conductive layer 120 is formed on insulation layer 102. In the present embodiment, conductive layers (110, 120) are outermost layers. However, the present embodiment is not limited to such and more interlayer insulation layers and conductive layers may further be laminated.

Conductive layer 110 is the outermost conductive layer on the first-surface (F1) side; and conductive layer 120 is the outermost conductive layer on the second-surface (F2) side. Solder resists (11, 12) are formed respectively on conductive layers (110, 120). However, opening portions (11a, 12a) are formed respectively in solder resists (11, 12). Thus, a predetermined location of conductive layer 110 (the location corresponding to opening portion (11a)) is exposed without being covered by solder resist 11 and becomes pad (P1). Also, a predetermined location of conductive layer 120 (the location corresponding to opening portion (12a)) becomes pad (P2). Pad (P1) becomes an external connection terminal for electrical connection with another wiring board, for example, and pad (P2) becomes an external connection terminal for mounting an electronic component, for example. However, the usage of pads (P1, P2) is not limited to such, and they may be used in any other way.

In the present embodiment, pads (P1, P2) have an anticorrosion layer made of Ni/Au film, for example, on their surfaces. Anticorrosion layers are formed by sputtering or the like. Also, an anticorrosion layer made of organic protective film may be formed by performing an OSP (organic solderability preservative) treatment. Such an anticorrosion layer is not always required, and it may be omitted unless necessary.

In adhesive layer 400 (adhesive layer 400 in cavity (R10)) covering third surface (F3) of electronic component 200, holes (401a, 402a) (each a via hole) are formed. Hole (401a) reaches electrode 210 of electronic component 200, and hole (402a) reaches electrode 220 of electronic component 200. By filling conductor (such as copper plating) in holes (401a, 402a), the conductor in each hole becomes via conductors (401b, 402b) (each a filled conductor) respectively. Since holes (401a, 402a) (via holes) are formed in adhesive layer 400 in cavity (R10), wiring board 10 (wiring board with a built-in electronic component) tends to become thin.

Electrode 210 of electronic component 200 and conductive layer 301 are electrically connected to each other by via conductor (401b). Also, electrode 220 of electronic component 200 and conductive layer 301 are electrically connected to each other by via conductor (402b). In the embodiment of the present invention, the conductive layer on adhesive layer 400 (the conductive layer electrically connected to electrodes (210, 220)) is the same layer as the conductive layer on core section (C) (conductive layer 301). Accordingly, wiring board 10 (wiring board with a built-in electronic component) tends to become thin.

Holes (311a, 312a) (each a via hole) are formed in insulation layer 101, and hole (322a) (a via hole) is formed in insulation layer 102. Hole (311a) reaches conductive layer 301 (in particular, conductive patterns electrically connected to electrodes (210, 220)), hole (312a) reaches conductive layer 301, and hole (322a) reaches conductive layer 302. By filling conductor (such as copper plating) in holes (311a, 312a, 322a) respectively, the conductor in each hole becomes via conductors (311b, 312b, 322b) respectively (each a filled conductor). Via conductors (311b, 312b, 322b) are shaped to be tapered columns (truncated cones) with a diameter decreasing toward core section (C), for example.

Conductive layer 301 and conductive layer 110 are electrically connected to each other by via conductors (311b, 312b). Also, conductive layer 302 and conductive layer 120 are electrically connected to each other by via conductor (322b).

In the present embodiment, electronic component 200 and via conductors (401b, 402b, 311b) form power lines, and via conductors (312b, 322b) and through-hole conductor (300b) form signal lines. In addition, in the present embodiment, via conductors (312b, 322b) are both filled conductors, and through-hole conductor (300b) is a conformal conductor.

Figure 2:
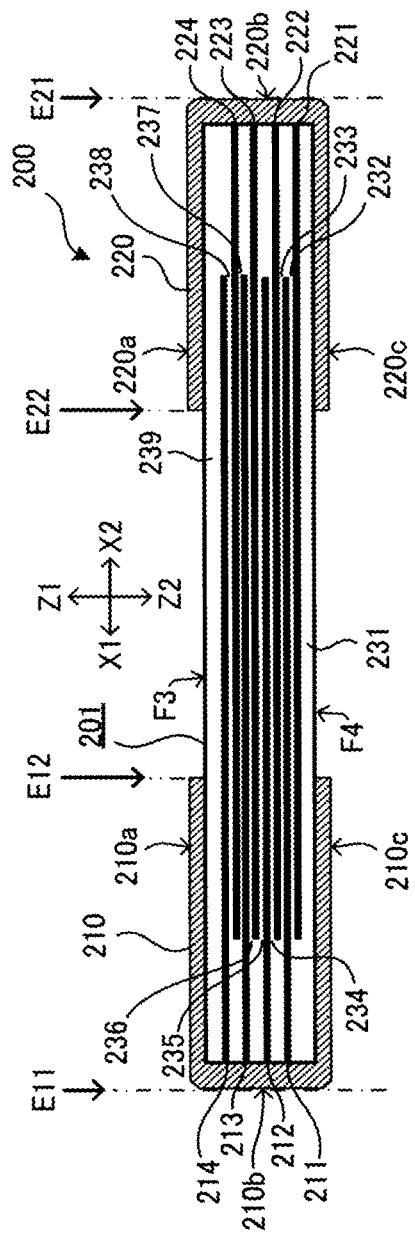
FIG. 2 is a cross-sectional view of an electronic component (capacitor) built into the wiring board with a built-in electronic component according to the first embodiment of the present invention.

Electronic component 200 is a chip-type MLCC (multilayer ceramic capacitor) as shown in FIG. 2, for example, and has capacitor body 201 and planar electrodes (210, 220). Electrodes (210, 220) are arrayed along a longitudinal direction (a direction X) of electronic component 200. Capacitor body 201 is formed by alternately laminating multiple dielectric layers (231~239) and multiple conductive layers (211~214, 221~224). Dielectric layers (231~239) are each made of ceramic, for example, conductive layers (211~214) are electrically connected to electrode 210, and conductive layers (221~224) are electrically connected to electrode 220.

Electrodes (210, 220) are respectively formed on both end portions of capacitor body 201. More specifically, in the present embodiment, electrodes (210, 220) are each U-shaped, being formed on a side surface, the upper surface and the lower surface of electronic component 200. Capacitor body 201 is covered by electrodes (210, 220) from the lower surface (the fourth-surface (F4) side) to a side surface and to the upper surface (the third-surface (F3) side). Hereinafter, regarding electrode 210, the portion to cover the upper surface of capacitor body 201 is referred to as upper portion (210a), the portion to cover a side surface of capacitor body 201 as side portion (210b), and the portion to cover the lower surface of capacitor body 201 as lower portion (210c). Also, regarding electrode 220, the portion to cover the upper surface of capacitor body 201 is referred to as upper portion (220a), the portion to cover a side surface of capacitor body 201 as side portion (220b), and the portion to cover the lower surface of capacitor body 201 as lower portion (220c). In the present embodiment, upper portion (210a) of electrode 210 is electrically connected to via conductor (401b), and upper portion (220a) of electrode 220 is electrically connected to via conductor (402b).

Since the central portion of capacitor body 201 positioned between electrode 210 and electrode 220 is not covered by electrodes (210, 220), and dielectric layers (231, 239) (ceramic) are exposed as shown in FIG. 2, the strength is relatively low. However, when electronic component 200 is mounted (built) in wiring board 10, the central portion of capacitor body 201 is covered by adhesive layer 400, insulative body (100c) or the like (see FIG. 1). Thus, capacitor body 201 is protected by such insulative materials (resin and the like).

Insulation layers (100a, 100b) are each made of glass cloth (core material) impregnated with epoxy resin (hereinafter referred to as glass epoxy). The core material has a smaller thermal expansion coefficient than a main material (epoxy resin in the present embodiment). As for the core material, for example, glass fiber (such as glass cloth and glass non-woven fabric), aramid fiber (such as aramid non-woven fabric), and inorganic material such as silica filler are preferable. However, basically, the material for insulation layers (100a, 100b) is not limited to any specific type, and they may be resin without core material. For example, instead of epoxy resin, the following may also be used: polyester resin, bismaleimide-triazine resin (BT resin), imide resin (polyimide), phenol resin, allyl polyphenylene ether resin (A-PPE resin) or the like. Each insulation layer may be formed with multiple layers made of different materials.

In the present embodiment, insulation layers (101, 102) are each made of glass epoxy, for example. However, insulation layers (101, 102) are not limited to such, and they may also be made of resin without core material, for example. Also, basically, the material for insulation layers (101, 102) may be any type. For example, instead of epoxy resin, the following may also be used: polyester resin, bismaleimide-triazine resin (BT resin), imide resin (polyimide), phenol resin, allyl polyphenylene ether resin (A-PPE resin) or the like. Each insulation layer may be formed with multiple layers made of different materials.

Conductive layers (301, 302, 110, 120) are each made of copper foil, copper plating or the like, for example (see FIGS. 12A and 16 described later). Each conductive layer includes, for example, wiring that forms an electrical circuit (electrical circuit including electronic component 200), a land, a plain pattern to enhance the strength of wiring board 10, and the like.

The material for each conductive layer and each via conductor in wiring board 10 is not limited to any specific type as long as it is conductive. It may be metallic or non-metallic. Each conductive layer and each via conductor may be formed with multiple layers made of different materials.

Figure 3:
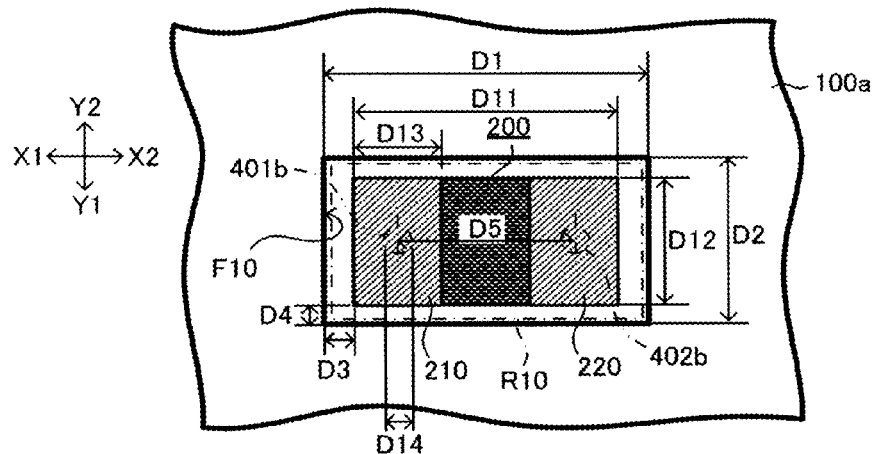
FIG. 3 is a plan view showing an electronic component (capacitor) accommodated in a cavity in the wiring board with a built-in electronic component according to the first embodiment of the present invention.

FIG. 3 shows electronic component 200 accommodated in cavity (R10) of core section (C).

The opening of cavity (R10) is shaped substantially rectangular, for example. Electronic component 200 is shaped substantially rectangular, for example, and the main surfaces of electronic component 200 are shaped substantially rectangular, for example. Namely, the periphery of electronic component 200 is formed with four sides. In the present embodiment, electronic component 200 has a planar shape corresponding to cavity (R10) (a similar shape with substantially the same size, for example).

Here, an example of a preferred value is shown for each measurement in FIG. 3.

Width (D1) of cavity (R10) in a longitudinal direction is approximately 1080 μm, and width (D2) of cavity (R10) in a lateral direction is approximately 580 μm. Width (D11) of electronic component 200 in a longitudinal direction is approximately 1000 μm, and width (D12) of electronic component 200 in a lateral direction is approximately 500 μm. Width (D3) of the gap between electronic component 200 and cavity (R10) in a longitudinal direction is approximately 40 μm (the clearance is twice as much, approximately 80 μm), and width (D4) of the gap between electronic component 200 and cavity (R10) in a lateral direction is approximately 40 μm (the clearance is twice as much, approximately 80 μm). Width (D13) of upper portion (210a) or lower portion (210c) of electrode 210, or of upper portion (220a) or lower portion (220c) of electrode 220, is approximately 250 μm.

The width (maximum diameter) of via conductors (401b, 402b) is each approximately 60 μm, and pitch (D5) of via conductors (401b, 402b) is approximately 800 μm.

The thickness of core section (C) is approximately 200 μm, and the thickness of electronic component 200 (thickness including the electrodes) is in an approximate range of 150 μm to 330 μm. The thickness of insulation layers (101, 102) is each approximately 60 μm, the thickness of each conductive layer is approximately 25 μm, and the thickness of solder resists (11, 12) is each approximately 20 μm. Then, the entire thickness of wiring board 10 is approximately 460 μm. In addition, L (line)/S (space) of each conductive layer is approximately 60/60 μm.

Figure 4:
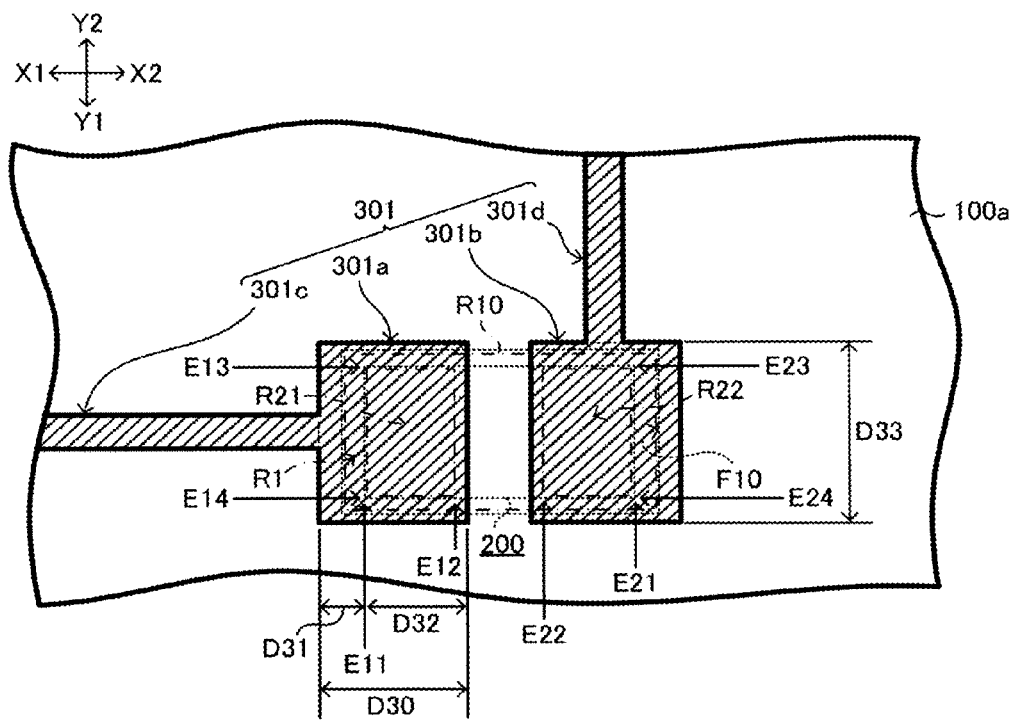
FIG. 4 is a plan view showing conductive patterns electrically connected to electrodes of an electronic component (capacitor) by via conductors in the wiring board with a built-in electronic component according to the first embodiment of the present invention.

FIG. 4 shows conductive patterns (301a~301d) of conductive layer 301 which are electrically connected to electronic component 200. As shown in FIG. 4, conductive patterns (301a, 301b) are each a planar conductive pattern, and conductive patterns (301c, 301d) are each a linear conductive pattern. In the present embodiment, conductive layer 301 is formed by a subtractive method (see FIGS. 8-12B described later). Conductive patterns (301a~301d) each include metal foil (such as copper foil) (see FIG. 12A described later), and are patterned by etching (see FIG. 12B described later). However, the material and manufacturing method for conductive patterns (301a~301d) are not limited specifically.

In the present embodiment, conductive patterns (301a, 301b), for example, are formed on insulation layer (100a). The shape and measurements of conductive patterns (301a, 301b) are each, for example, a rectangle of approximately 420 μm (width (D30) in FIG. 4)×approximately 670 μm (width (D33) in FIG. 4). Here, conductive pattern (301a) corresponds to the land of via conductor (401b), and conductive pattern (301b) corresponds to the land of via conductor (402b).

Conductive pattern (301a) is formed from outer end (E11) to inner end (E12) while maintaining the width from first end (E13) to second end (E14) (in the present embodiment, the same as width (D12) of electronic component 200 shown in FIG. 3). Also, conductive pattern (301b) is formed from outer end (E21) to inner end (E22) while maintaining the width from first end (E23) to second end (E24) (in the present embodiment, the same as width (D12) of electronic component 200 shown in FIG. 3). In the present embodiment, first ends (E13, E23), second ends (E14, E24) and outer ends (E11, E21) correspond to end surfaces (side surfaces) of electronic component 200 respectively, namely to its periphery. However, it is not always required for them to correspond to the periphery (see FIGS. 21A and 21B described later).

In FIG. 4, measurement (D31) from outer end (E11) of electrode 210 to the outer end of conductive pattern (301a) is approximately 50 μm or greater, for example. Also, in FIG. 4, measurement (D32) from outer end (E11) of electrode 210 to the inner end of conductive pattern (301a) is approximately 50 μm or greater, for example. Namely, in the present embodiment, conductive layer 301 has planar conductive pattern (301a) in a region that extends at least 50 μm from an end (outer end E11) of electronic component 200 toward the inner side and the outer side of electronic component 200 respectively.

Here, only conductive pattern (301a) is described. However, the same applies to conductive pattern (301b). Namely, conductive layer 301 has planar conductive pattern (301b) in a region that extends at least 50 μm from the other end (outer end E21) of electronic component 200 toward the inner side and the outer side of electronic component 200 respectively.

Conductive pattern (301a) (the land of via conductor 401b) is formed on insulation layer (100a) in a region that includes the entire region (R21) directly on upper portion (210a) of electrode 210, and conductive pattern (301b) (the land of via conductor 402b) is formed on insulation layer (100a) in a region that includes the entire region (R22) directly on upper portion (220a) of electrode 220. More specifically, on one side of a direction X (a longitudinal direction of electronic component 200), conductive pattern (301a) is formed to extend inward (toward the X2 side) beyond inner end (E12) of electrode 210, and on the other side of the direction X, it is formed to extend outward (toward the X1 side) beyond wall surface (F10) of cavity (R10). In addition, on each of both sides of a direction Y (a lateral direction of electronic component 200), conductive pattern (301a) is formed to extend outward beyond wall surface (F10) of cavity (R10). Furthermore, on one side of a direction X (a longitudinal direction of electronic component 200), conductive pattern (301b) is formed to extend inward (toward the X1 side) beyond inner end (E22) of electrode 220, and on the other side of the direction X, it is formed to extend outward (toward the X2 side) beyond wall surface (F10) of cavity (R10). In addition, on each of both sides of a direction Y (a lateral direction of electronic component 200), conductive pattern (301b) is formed to extend outward beyond wall surface (F10) of cavity (R10).

In the present embodiment, electronic component 200 has electrode 210 (first electrode) near outer end (E11), and electrode 220 (second electrode) near outer end (E21). Electrodes (210, 220) are arrayed along a longitudinal direction (a direction X) of electronic component 200. Then, conductive layer 301 has planar conductive patterns (301a, 301b) directly on their respective outer edges (in particular, the entire edges) of electrodes (210, 220) of electronic component 200. Among the edges (four sides) of electrodes (210, 220), the outer edges of electrode 210 mean three sides which face outward (three sides excluding inner end (E12) which faces inward); namely, outer end (E11), first end (E13) and second end (E14). Among the edges (four sides) of electrode 220, the outer edges of electrode 220 mean three sides which face outward (three sides excluding inner end (E22) which faces inward); namely, outer end (E21), first end (E23) and second end (E24). Also, in the present embodiment, those three sides correspond to the periphery of electronic component 200. Namely, conductive pattern (301a) is positioned directly on the periphery of electronic component 200, and conductive pattern (301b) is positioned directly on the periphery of electronic component 200.

In the present embodiment, conductive pattern (301a) is positioned directly on outer end (E11) and inner end (E12) of electrode 210 (in particular, the entire region from first end (E13) to second end (E14)). Then, excluding an inner side (X2 side) of conductive pattern (301a), three sides (three sides on the X1, Y1 and Y2 sides) are positioned outside cavity (R10), spanning gap (R1). Also, conductive pattern (301b) is positioned directly on outer end (E21) and inner end (E22) of electrode 220 (in particular, the entire region from first end (E23) to second end (E24)). Then, excluding an inner side (X1 side) of conductive pattern (301b), three sides (three sides on the X2, Y1 and Y2 sides) are positioned outside cavity (R10), spanning gap (R1). However, that is not the only option, and the above three sides of conductive patterns (301a, 301b) may each be positioned directly on gap (R1) (see FIG. 21A described later).

In the present embodiment, conductive pattern (301a) is positioned directly on the entire portion of electrode 210, and conductive pattern (301b) is positioned directly on the entire portion of electrode 220. However, the present embodiment is not limited to such, and it is not always required that conductive pattern (301a) or (301b) be positioned directly on the entire portion of electrode 210 or 220 (see FIG. 21B described later).

Conductive pattern (301a) is electrically connected to electrode 210 of electronic component 200 by via conductor (401b), and conductive pattern (301b) is electrically connected to electrode 220 of electronic component 200 by via conductor (402b) (see FIG. 1). Then, conductive pattern (301a) is electrically connected to conductive pattern (301c) (wiring), and conductive pattern (301b) is electrically connected to conductive pattern (301d) (wiring). Conductive patterns (301a, 301b) are electrically connected respectively by conductive patterns (301c, 301d) to, for example, other conductive patterns of conductive layer 301 not shown in the drawings. Conductive patterns (301a~301d) are conductive patterns that are included in conductive layer 301, and they are formed simultaneously when conductive layer 301 is patterned, for example (see FIGS. 12A and 12B described later). In the present embodiment, conductive pattern (301a) and conductive pattern (301c) (wiring), as well as conductive pattern (301b) and conductive pattern (301d) (wiring), are formed to be contiguous.

Figure 5:
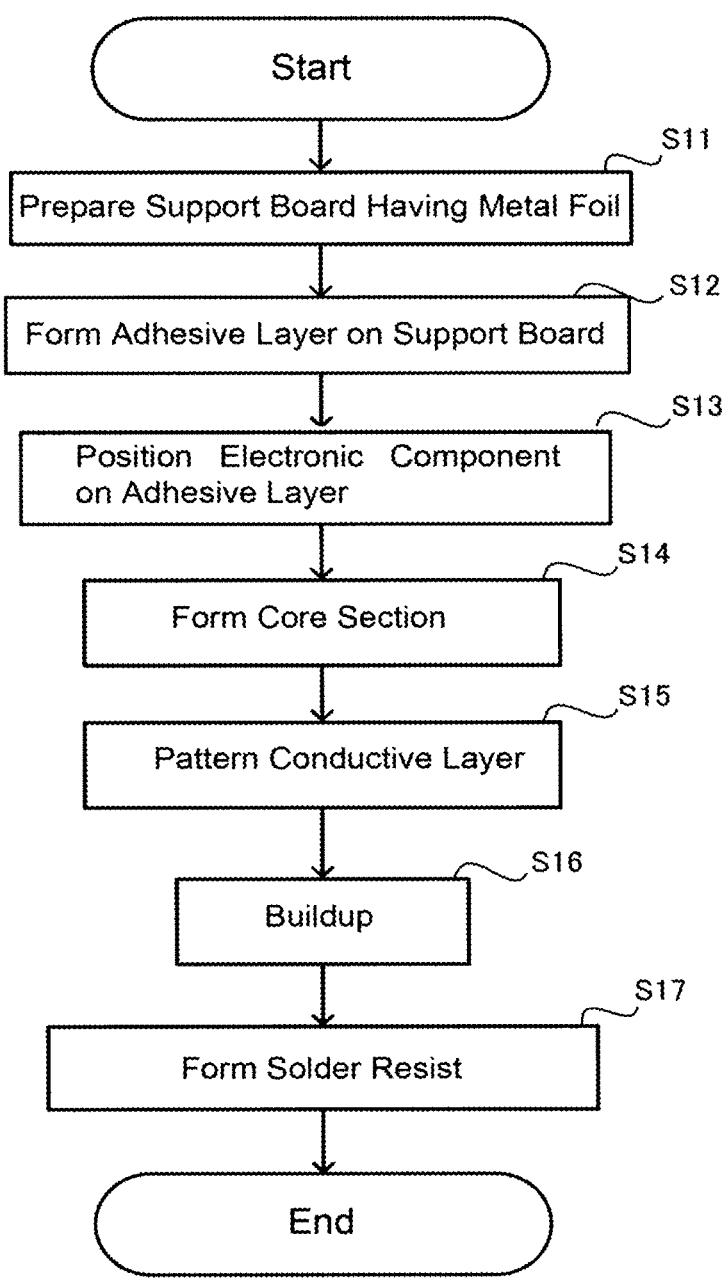
FIG. 5 is a flowchart showing a method for manufacturing a wiring board with a built-in electronic component according to the first embodiment of the present invention.

In the following, a method for manufacturing wiring board 10 is described with reference to FIG. 5 and others. FIG. 5 is a flowchart schematically showing the contents and the order of a method for manufacturing wiring board 10 according to the present embodiment. For the convenience of description, the unfinished wiring board in any process is referred to as a laminate.

Figure 6A:
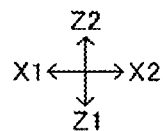
FIG. 6A is a view to illustrate a step for preparing a support material having a conductive film on one surface in the manufacturing method shown in FIG. 5.
Figure 6A:

In step (S11), carrier 1001 (such as a support board with metal foil) having metal foil 1002 (conductive film) on one surface is prepared as shown in FIG. 6A. Carrier 1001 is made of a conductive material such as aluminum or of an insulative material such as insulative polymer. Metal foil 1002 is made of copper foil, for example.

Figure 6B:
FIG. 6B is a view to illustrate a step for forming holes in the conductive film of the support material in the manufacturing method shown in FIG. 5.

Then, as shown in FIG. 6B, using a UV laser, for example, holes (1003, 1004) are formed so as to penetrate through metal foil 1002 and reach carrier 1001. By making holes (1003, 1004), recesses are formed in carrier 1001. In the present embodiment, holes (1003, 1004) work as alignment marks. Accordingly, when forming holes (401a, 402a) (see FIG. 11A described later), it is easy to align holes (401a, 402a) with electrodes (210, 220) of electronic component 200.

Figure 6C:
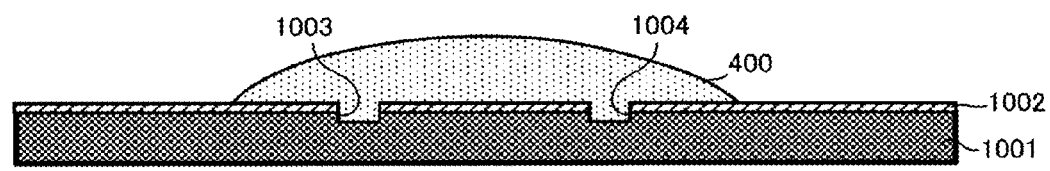
FIG. 6C is a view to illustrate a step for forming an adhesive layer on the conductive film of the support material in the manufacturing method shown in FIG. 5.

Next, in step (S12) in FIG. 5, an adhesive layer is formed on carrier 1001 (support material). Specifically, as shown in FIG. 6C, using NCP coating, for example, adhesive layer 400 is formed on metal foil 1002 (in particular, in the central portion of carrier 1001). In doing so, adhesive layer 400 is filled in holes (1003, 1004).

Next, in step (S13) in FIG. 5, electronic component 200 is positioned on adhesive layer 400.

Figure 6D:
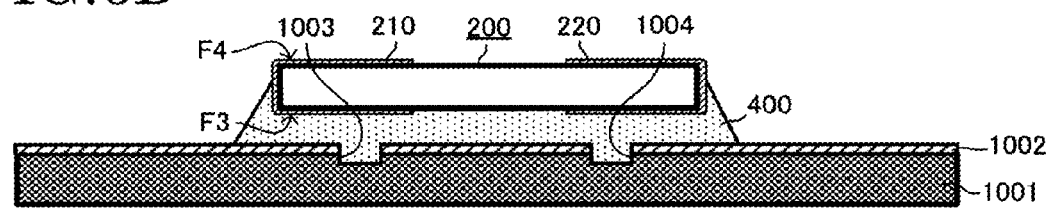
FIG. 6D is a view to illustrate a step for fixing an electronic component onto the support material using the insulative adhesive layer in the manufacturing method shown in FIG. 5.

Specifically, as shown in FIG. 6D, electronic component 200 having electrodes (210, 220) is prepared, electronic component 200 is positioned on adhesive layer 400, and then thermal pressing is conducted, for example. In doing so, adhesive layer 400 is cured and electronic component 200 is fixed onto metal film 1002 by insulative adhesive layer 400. Electrodes (210, 220) of electronic component 200 are positioned respectively on holes (1003, 1004).

Figure 7A:
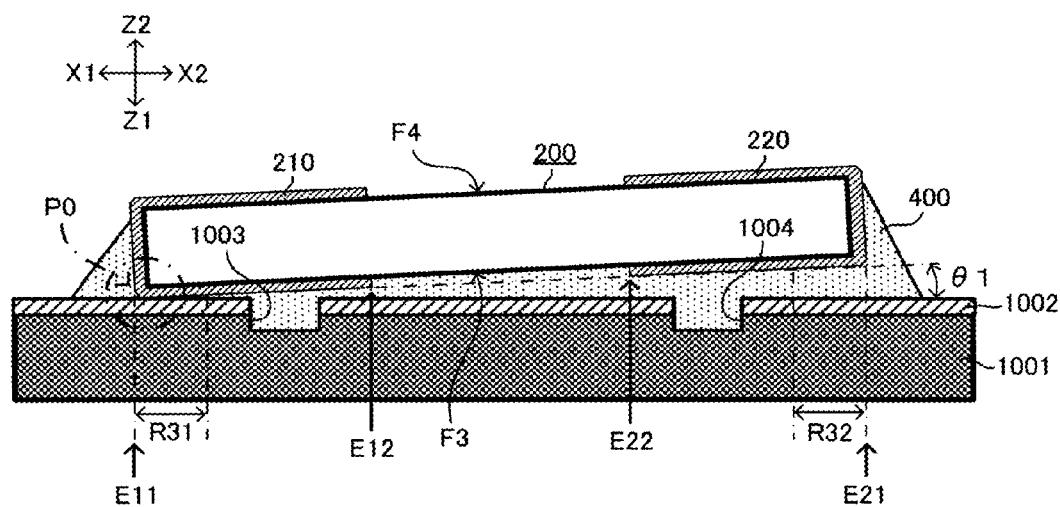
FIG. 7A is a view showing the electronic component fixed on the support material by the step in FIG. 6D.
Figure 7B:
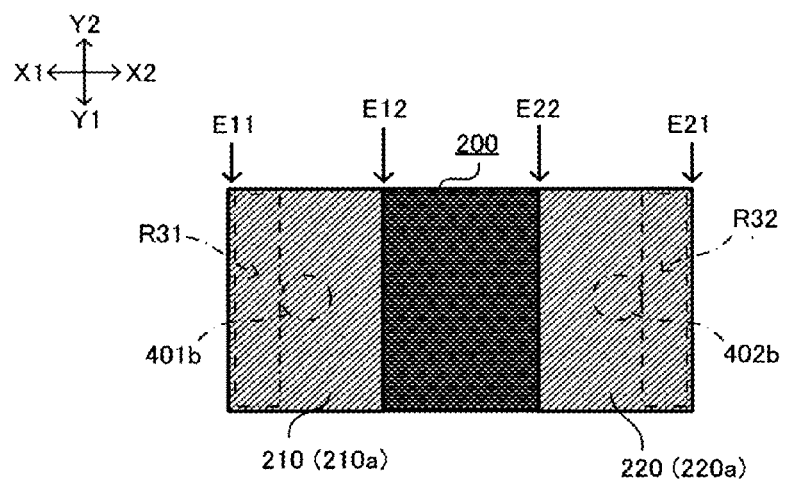
FIG. 7B is a view showing regions on the electrode surfaces of the electronic component which tend to make contact with the conductive film on the support material.

At that time, it is not always the case that electronic component 200 is fixed at an angle parallel to a main surface of carrier 1001. For example, as shown in FIG. 7A, it is possible that electronic component 200 is fixed by inclining at angle (θ1) against a main surface of carrier 1001. In such a case, electrode 210 or 220 of electronic component 200 may have direct contact with metal foil 1002 on carrier 1001 without adhesive layer 400 (insulative body) in between. In an example in FIG. 7A, electrode 210 of electronic component 200 is in contact with metal foil 1002 at contact spot (P0). Contact spot (P0) is positioned near outer end (E11). Electronic component 200 tends to incline in a longitudinal direction. Electrode 210 or 220 of electronic component 200 and metal foil 1002 tend to make contact in region (R31) or (R32) near either end in a longitudinal direction of electronic component 200 (outer end E11 or E21) shown in FIG. 7B.

Next, a core section is formed in step (S14) in FIG. 5.

Figure 8:
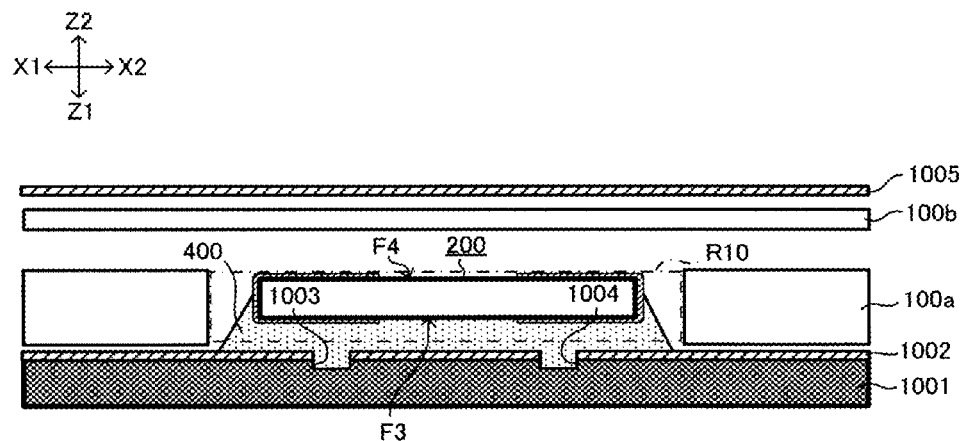
FIG. 8 is a view to illustrate a first step for forming a core section in the manufacturing method shown in FIG. 5.

Specifically, as shown in FIG. 8, insulation layer (100a) (insulative substrate) having cavity (R10) (hole) is positioned on metal foil 1002. Accordingly, electronic component 200 fixed to adhesive layer 400 is positioned in cavity (R10) of insulation layer (100a). Electronic component 200 is surrounded by insulation layer (100a). Also, semi-cured insulation layer (100b) is positioned on insulation layer (100a) and on fourth surface (F4) of electronic component 200. Insulation layer (100a) is made of completely cured glass epoxy, for example, and insulation layer (100b) is made of glass epoxy prepreg, for example. Metal foil 1005 is further positioned on insulation layer (100b). Metal foil 1005 is made of copper foil, for example.

Next, as shown in FIG. 9, by pressing semi-cured insulation layer (100b), resin flows out from insulation layer (100b) to enter cavity (R10). Accordingly, insulative body (100c) (resin that forms insulation layer 100b) is filled in gap (R1) between insulation layer (100a) (insulative substrate) and electronic component 200 in cavity (R10).

Figure 10:
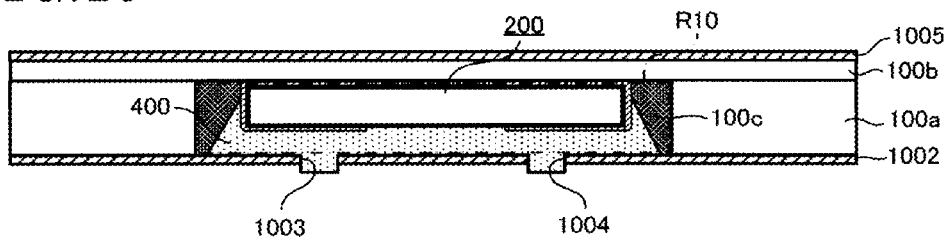
FIG. 10 is a view to illustrate a third step for forming the core section in the manufacturing method shown in FIG. 5.

When insulative body (100c) is filled in cavity (R10), the filler resin (insulative body 100c) is cured by heating, for example. Then, as shown in FIG. 10, carrier 1001 (support material) is removed from electronic component 200.

Figure 11A:
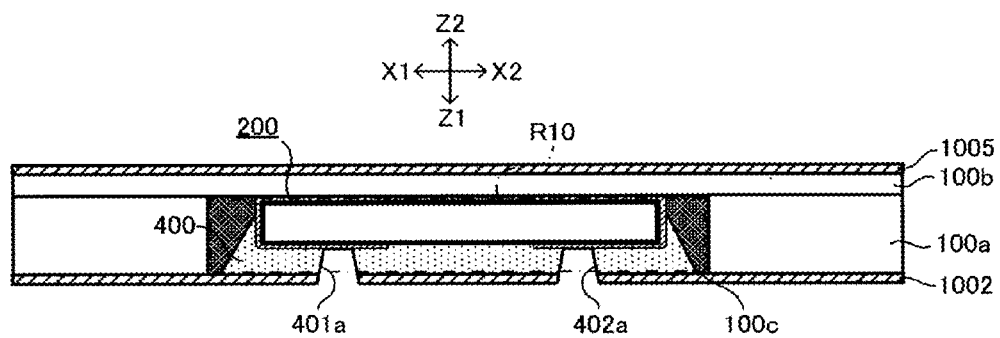
FIG. 11A is a view to illustrate a fourth step for forming the core section in the manufacturing method shown in FIG. 5.

Next, as shown in FIG. 11A, by irradiating a laser at metal foil 1002 from the Z1 side, for example, holes (401a, 402a) are formed in adhesive layer 400. To increase the laser absorption rate, the surface of metal foil 1002 may be blackened prior to laser irradiation.

Figure 11B:
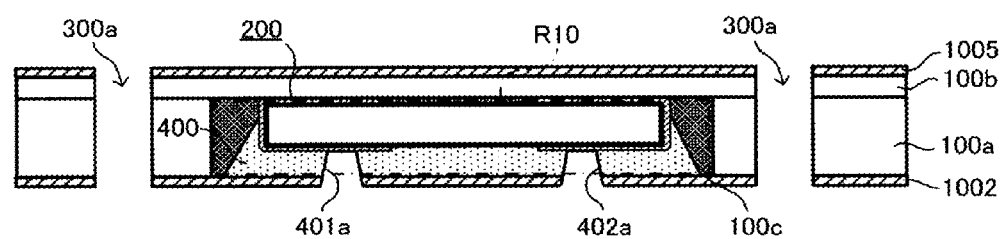
FIG. 11B is a view to illustrate a fifth step for forming the core section in the manufacturing method shown in FIG. 5.

Next, as shown in FIG. 11B, using a drill, for example, a hole is made in a laminate. Accordingly, through hole (300a) is formed so as to penetrate through insulation layers (100a, 100b).

After through hole (300a) and holes (401a, 402a) are formed, it is preferred to perform desmearing (cleaning). By desmearing, unnecessary conduction (short circuiting) is suppressed.

Figure 12A:
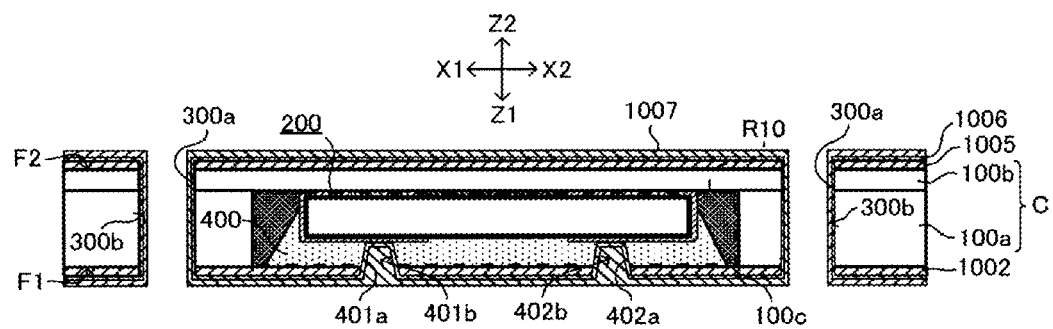
FIG. 12A is a view to illustrate a sixth step for forming the core section in the manufacturing method shown in FIG. 5.

Next, by a panel plating method, for example, electroless plated film 1006 and electrolytic plating 1007 are formed on the surfaces of the laminate, namely, on metal foils (1002, 1005), on the wall surface of through hole (300a) and in holes (401a, 402a) respectively as shown in FIG. 12A. Specifically, first, electroless copper-plated film 1006, for example, is formed using a chemical plating method, for example. Then, using the electroless plated film 1006 as a seed layer, electrolytic copper plating 1007, for example, is formed using a plating solution. In doing so, electroless plated film 1006 and electrolytic plating 1007 are formed on the wall surface of through hole (300a) to form through-hole conductor (300b). As a result, core section (C) is formed, having insulation layers (100a, 100b) and through-hole conductor (300b). Also, by filling electroless plated film 1006 and electrolytic plating 1007 in holes (401a, 402a) respectively, via conductors (401b, 402b) are formed.

Figure 12B:
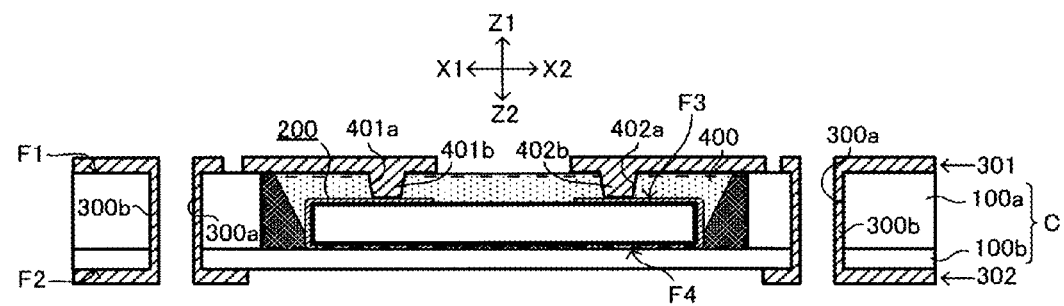
FIG. 12B is a view to illustrate a step for patterning a conductive layer on the core section in the manufacturing method shown in FIG. 5.

Next, in step (S15) in FIG. 5, each conductive layer formed on first surface (F1) and second surface (F2) of core section (C) is patterned using etching resist and an etching solution, for example. Specifically, each conductive layer is covered by an etching resist having a pattern corresponding to conductive layer 301 or 302, and portions of each conductive layer not covered by the etching resist (portions exposed through opening portions of the etching resist) are etched away. Accordingly, conductive layers (301, 302) are formed respectively on first surface (F1) and second surface (F2) of core section (C) as shown in FIG. 12B. Etching is not limited to wet etching, and may be dry etching.

In the present embodiment, conductive layer 301 has planar conductive patterns (301a, 301b) (see FIG. 4) directly on the outer edges respectively of electrodes (210, 220) of electronic component 200. Also, conductive pattern (301a) is positioned directly on the periphery of electronic component 200, and conductive pattern (301b) is positioned directly on the periphery of electronic component 200. Accordingly, during the above etching for patterning conductive layer 301, damage to electrodes (210, 220) of electronic component 200 is suppressed. In the following, the reasons are described in detail using a comparative example.

Figure 13:
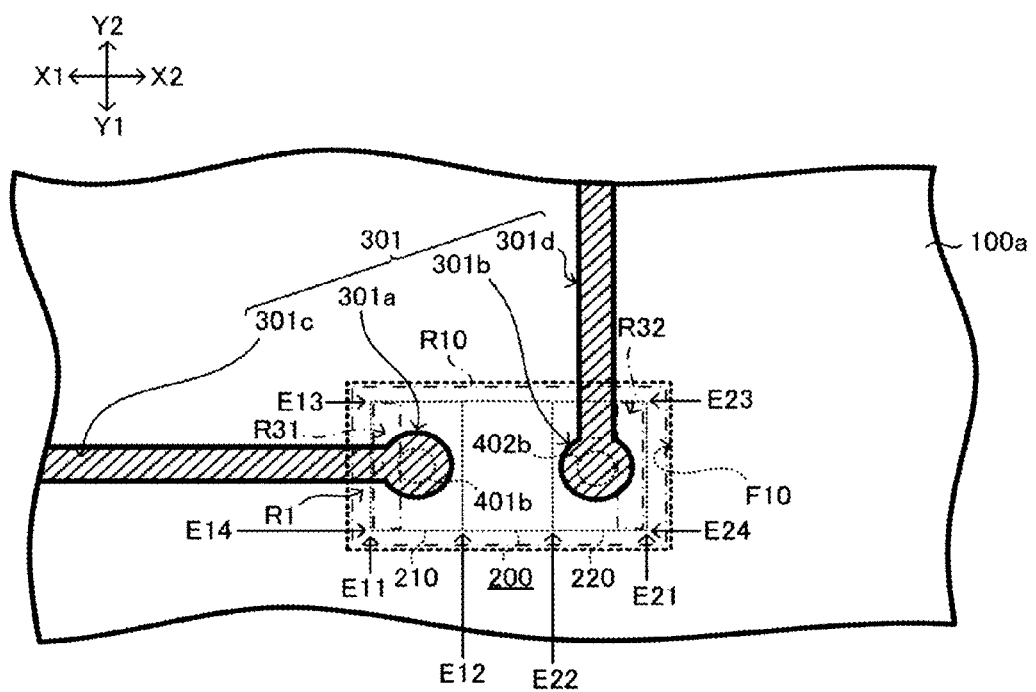
FIG. 13 regards a wiring board with a built-in electronic component according to a comparative example, a plan view showing conductive patterns to be electrically connected to electrodes of an electronic component (capacitor) by via conductors.

FIG. 13 shows a comparative example. In the comparative example shown in FIG. 13, the same numerical reference as in wiring board 10 is used for an element that corresponds to the identical element in wiring board 10 of the present embodiment for the purpose of convenience (see FIGS. 1, 4 and the like).

In a comparative example shown in FIG. 13, lands of via conductors (401b, 402b) (planar conductive patterns (301a, 301b)) to be connected to electrodes (210, 220) of electronic component 200 are smaller. Conductive layer 301 does not have planar conductive patterns (301a, 301b) directly on outer ends (E11, E21). Thus, conductive patterns (301a, 301b) are not formed in at least part of regions (R31, R32) (see FIGS. 7A and 7B) where electrode 210 or 220 of electronic component 200 tends to make contact with metal foil 1002. In such a case, during the above etching for patterning conductive layer 301, since the conductor in region (R31) or (R32) is also etched away, contact portion (P0) (FIG. 7A) between electrode 210 or 220 of electronic component 200 and metal foil 1002 may likely be etched. Then, if contact portion (P0) is etched, etching may not stop at the boundary of electrode 210 or 220 of electronic component 200 and metal foil 1002 (see FIG. 7A), leading to concern that electrode 210 or 220 may even be etched.

For that matter, in wiring board 10 of the present embodiment, conductive layer 301 has planar conductive pattern (301a) in a region that extends at least 50 µm from an end of electronic component 200 (outer end E11) toward the inside of electronic component 200, and has planar conductive pattern (301b) in a region that extends at least 50 µm from the other end of electronic component 200 (outer end E21) toward the inside of electronic component 200. Here, the region that extends 50 µm from one end (outer end E11) or the other end (outer end E21) of electronic component 200 toward the inside of electronic component 200 corresponds to region (R31) or (R32). In such a region, electrode 210 or 220 of electronic component 200 tends to make contact with metal foil 1002 (see FIGS. 7A and 7B).

In wiring board 10 of the present embodiment, since conductive layer 301 has planar conductive patterns (301a, 301b) in regions that extend 50 µm from one end (outer end E11) or the other end (outer end E21) of electronic component 200 toward the inside of electronic component 200, namely, in regions (R31, R32) (see FIGS. 7A and 7B), the conductors in regions (R31, R32) remain without being etched during the above etching for patterning conductive layer 301. Accordingly, there is lower risk for contact spot (P0) between electrode 210 or 220 of electronic component 200 and metal foil 1002 (FIG. 7A) to be etched. In areas other than contact spot (P0), since adhesive layer 400 is present between electrode 210 or 220 of electronic component 200 and metal foil 1002 (see FIG. 7A), and adhesive layer 400 is insulative, tolerance to an etching solution for conductor (such as copper) is easier to enhance. Therefore, when etching is conducted on areas other than contact spot (P0), etching tends to stop between electrode 210 or 220 of electronic component 200 and metal foil 1002 (especially at adhesive layer 400). Accordingly, damage to electrodes (210, 220) of electronic component 200 is suppressed during the manufacturing process, enhancing electrical reliability of wiring board 10. As a result, the yield of wiring board 10 improves.

The location in regions (R31, R32) where electrode 210 or 220 of electronic component 200 especially makes contact with metal foil 1002 is directly on the outer edge of electrode 210 or 220 of electronic component 200. Therefore, if conductive layer 301 has planar conductive pattern (301a) or (301b) at least in the area directly on the outer edge of electrode 210 or 220 of electronic component 200, damage to electrodes (210, 220) of electronic component 200 is suppressed during the manufacturing process, thus enhancing the electrical reliability of wiring board 10.

Next, buildup is conducted on both surfaces of core section (C) in step (S16) in FIG. 5.

Figure 14:
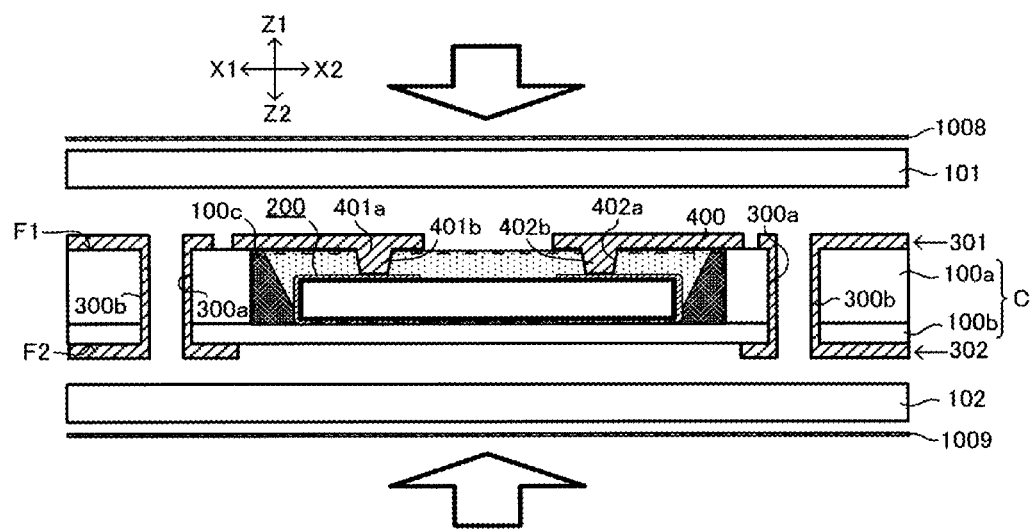
FIG. 14 is a view to illustrate a first step for a buildup in the manufacturing method shown in FIG. 5.
Figure 15:
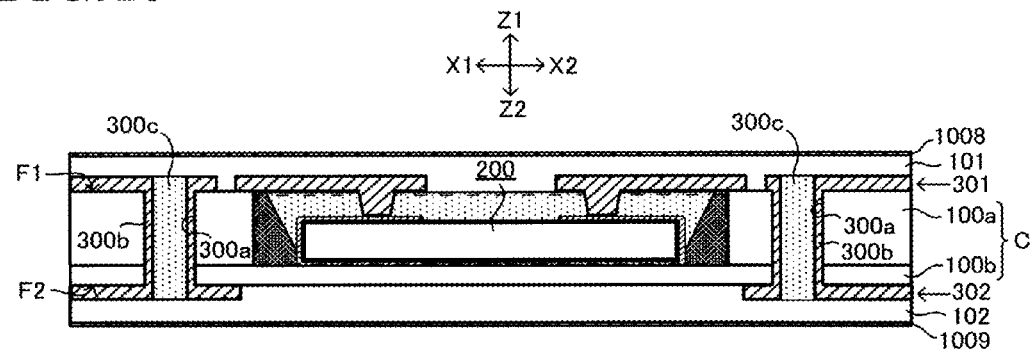
FIG. 15 is a view to illustrate a second step subsequent to the step in FIG. 14.

Specifically, as shown in FIG. 14, insulation layer 101 is positioned on first surface (F1) of core section (C) and on conductive layer 301, and insulation layer 102 is positioned on second surface (F2) of core section (C) and on conductive layer 302. Moreover, metal foil 1008 is positioned on insulation layer 101, and metal foil 1009 is positioned on insulation layer 102. Insulation layers (101, 102) are each formed with glass epoxy prepreg. Then, semi-cured insulation layers (101, 102) are adhered to core section (C) and conductive layers (301, 302) and pressed. In doing so, as shown in FIG. 15, resin (insulative body 300c) forming insulation layers (101, 102) is flowed out so as to be filled in through-hole conductor (300b) in through hole (300a). Also, at the same time as pressing, or after pressing, the laminate is heated to cure each of insulation layers (101, 102). By curing insulation layers (101, 102) on both surfaces at the same time, warping of core section (C) tends to be suppressed.

Figure 16:
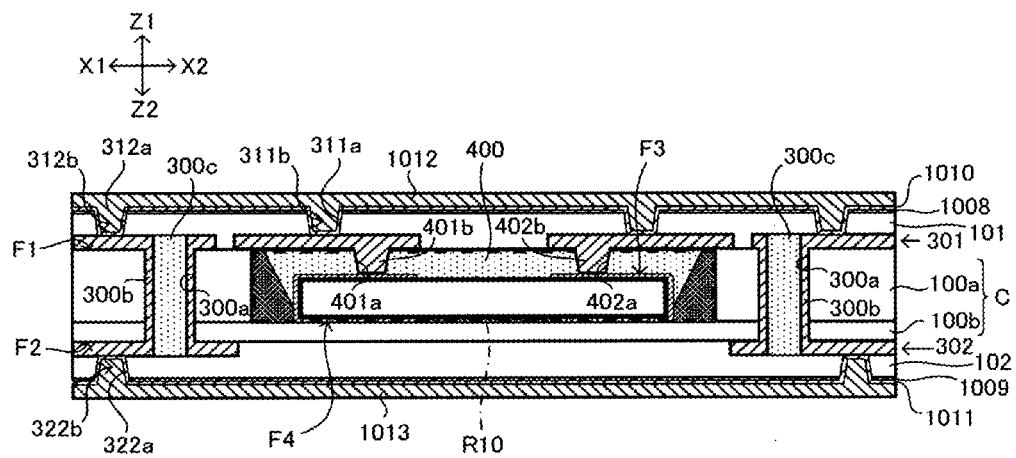
FIG. 16 is a view to illustrate a third step subsequent to the step in FIG. 15.

Next, using a laser, for example, holes (311a, 312a) (each a via hole) are formed in insulation layer 101 and metal foil 1008, and hole (322a) (via hole) is formed in insulation layer 102 and metal foil 1009 (see FIG. 16). Holes (311a, 312a) each penetrate through insulation layer 101 and metal foil 1008, and hole (322a) penetrates through insulation layer 102 and metal foil 1009. Then, holes (311a, 312a) each reach conductive layer 301, and hole (322a) reaches conductive layer 302. More specifically, hole (311a) reaches planar conductive pattern (301a) or (301b) (FIG. 4), and holes (312a, 322a) reach their respective spots directly on through-hole conductor (300b). After that, desmearing is conducted if required.

Next, using a panel plating method, for example, electroless copper-plated films (1010, 1011), for example, and electrolytic platings (1012, 1013) are formed respectively on the surfaces of the laminate, namely on metal foils (1008, 1009) and in holes (311a, 312a, 322a) as shown in FIG. 16. Specifically, first, electroless copper-plated films (1010, 1011), for example, are formed by a chemical plating method, for example, and then using electroless plated films (1010, 1011) as seed layers, electrolytic copper platings (1012, 1013), for example, are formed using a plating solution. In doing so, electrolytic platings (1012, 1013) are filled respectively in holes (311a, 312a, 322a) and via conductors (311b, 312b, 322b) made of copper plating, for example, are formed.

Figure 17:
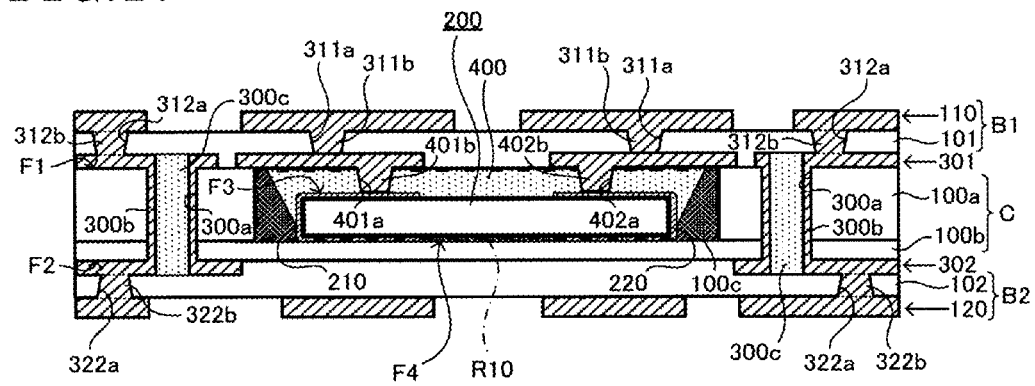
FIG. 17 is a view to illustrate a fourth step subsequent to the step in FIG. 16.

Next, using etching resist and an etching solution, for example, each conductive layer formed on insulation layers (101, 102) is patterned. Specifically, each conductive layer is covered by etching resist having a pattern corresponding to that of conductive layer 110 or 120, and the areas of each conductive layer not covered by the etching resist (areas exposed through opening portions of the etching resist) are etched away. Accordingly, conductive layers (110, 120) are formed respectively on insulation layers (101, 102) as shown in FIG. 17. Dry etching may also be employed instead of wet etching. As a result, first buildup section (B1) formed with insulation layer 101 and conductive layer 110 is formed on first surface (F1) of core section (C), and second buildup section (B2) formed with insulation layer 102 and conductive layer 120 is formed on second surface (F2) of core section (C). The seed layer for electrolytic plating is not limited to electroless plated film. Sputtered film or the like may also be used as a seed layer instead of electroless plated films (1010, 1011).

Next, in step (S17) in FIG. 5, solder resist 11 with opening portion (11a) and solder resist 12 with opening portion (12a) are formed respectively on insulation layers (101, 102) (see FIG. 1). Conductive layers (110, 120) are covered by solder resists (11, 12) respectively except for predetermined locations (pads (P1, P2) and the like) corresponding to opening portions (11a, 12a). Solder resists (11, 12) are formed, for example, by screen printing, spray coating, roll coating, lamination or the like.

Next, by sputtering or the like, anticorrosion layers made of Ni/Au, for example, are formed respectively on conductive layers (110, 120), specifically on surfaces of pads (P1, P2) which are not covered by solder resists (11, 12) (see FIG. 1). Alternatively, anticorrosion layers made of organic protective film may also be formed by an OSP treatment.

Through the above procedures, wiring board 10 of the present embodiment is completed (FIG. 1). Then, electrical testing is performed on electronic component 200 (checking its capacity, insulation and the like).

The manufacturing method of the present embodiment is suitable for manufacturing wiring board 10. Using such a manufacturing method, an excellent wiring board 10 is obtained at low cost.

Wiring board 10 of the present embodiment is electrically connected to other electronic components or other wiring boards, for example. Another electronic component (such as an IC chip) which is different from electronic component 200 may be mounted on pad (P2) of wiring board 10 by soldering or the like, for example. Also, wiring board 10 may be mounted on another wiring board (such as a motherboard) through pad (P1). Wiring board 10 of the present embodiment may be used as a circuit board of a cell phone, for example.

Second Embodiment

The second embodiment of the present invention is described focusing on differences with the above first embodiment. Here, the same reference number is used for an element identical to the element shown in above FIG. 1 and others, and regarding a common portion already described, namely, the portion whose description would be redundant, such description is omitted or simplified here.

Figure 18:
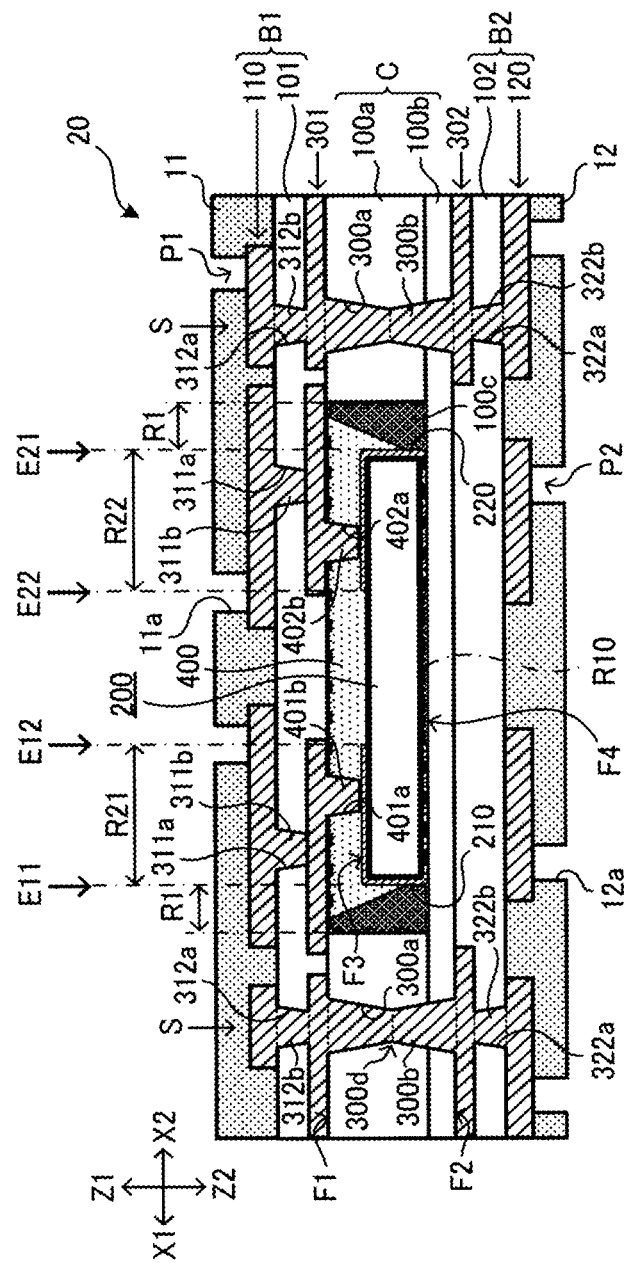
FIG. 18 is a cross-sectional view of a wiring board with a built-in electronic component according to a second embodiment of the present invention.

As shown in FIG. 18, wiring board 20 according to the second embodiment has through-hole conductor (300b) in an hourglass shape. Specifically, through hole (300a) is formed in core section (C), and through-hole conductor (300b) is formed by filling conductor (such as copper plating) in through hole (300a). Through-hole conductor (300b) has narrowed portion (300d) where the width is the smallest, and tapers with the width decreasing toward narrowed portion (300d) from first surface (F1) and second surface (F2) of core section (C) respectively. Conductive layer 301 on first surface (F1) of core section (C) and conductive layer 302 on second surface (F2) of core section (C) are electrically connected to each other by through-hole conductor (300b). Hole (312a) reaches conductive layer 301 (in particular a spot directly on through-hole conductor 300b), and hole (322a) reaches conductive layer 302 (in particular a spot directly on through-hole conductor 300b).

In the present embodiment, electronic component 200 and via conductors (401b, 402b, 311b) form power lines. Also, in the present embodiment, via conductors (312b, 322b) and through-hole conductor (300b) are each a filled via, and they form filled stack (S) by being stacked in a direction Z. Then, filled stack (S) forms a signal line.

An example of a preferred value is shown for each measurement in FIGS. 3 and 4 in wiring board 20 of the present embodiment.

Width (D1) of cavity (R10) in a longitudinal direction is approximately 680 μm, and width (D2) of cavity (R10) in a lateral direction is approximately 380 μm. Width (D11) of electronic component 200 in a longitudinal direction is approximately 600 μm, and width (D12) of electronic component 200 in a lateral direction is approximately 300 μm. Width (D13) of upper portion (210a) or lower portion (210c) of electrode 210, or of upper portion (220a) or lower portion (220c) of electrode 220, is approximately 230 μm.

The widths (maximum diameters) of via conductors (401b, 402b) are each approximately 60 μm, and pitch (D5) between via conductor (401b) and via conductor (402b) is approximately 420 μm.

The thickness of core section (C) is approximately 200 μm, and the thickness of electronic component 200 (thickness including electrodes) is in an approximate range of 150 μm to 330 μm. The thicknesses of insulation layers (101, 102) are each approximately 30 μm, the thicknesses of inner conductive layers (301, 302) are each approximately 20 μm, the thicknesses of outer conductive layers (110, 120) are each approximately 15 μm, and the thicknesses of solder resists (11, 12) are each approximately 15 μm. Then, the entire thickness of wiring board 10 is approximately 360 μm. In addition, the L/S of inner conductive layers (301, 302) is each approximately 25/25 μm, and the L/S of outer conductive layers (110, 120) is each approximately 15/15 μm. Shapes and measurements of conductive patterns (301a, 301b) are each a rectangle of approximately 380 μm (width D30 in FIG. 4)×approximately 450 μm (width D33 in FIG. 4). Conductive pattern (301a) corresponds to the land of via conductor (401b), and conductive pattern (301b) corresponds to the land of via conductor (402b).

Wiring board 20 of the present embodiment is manufactured by substantially the same manufacturing method (FIG. 5) described in the first embodiment except for the method for forming each conductive layer (conductive layers 301, 302, 110, 120). In the following, a method is described for forming each conductive layer according to the present embodiment.

In the present embodiment, each conductive layer is formed by a semi-additive (SAP) method.

Figure 19A:
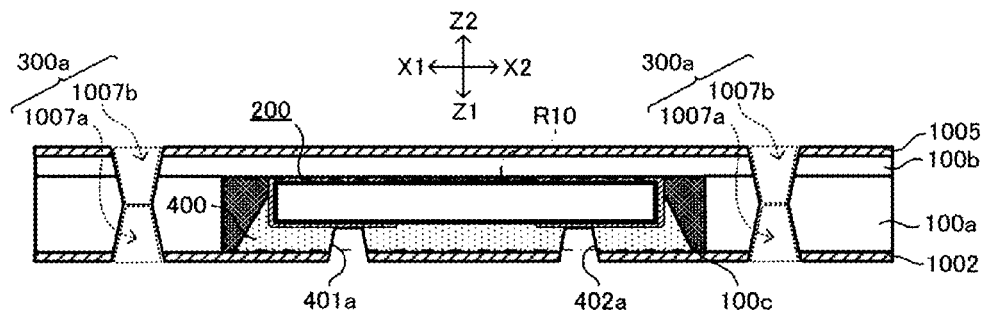
FIG. 19A is a view to illustrate a first step of a method for forming a first conductive layer according to the second embodiment of the present invention.

The same as in the first embodiment, the laminate (insulation layers (100a, 100b), metal foils (1002, 1005) and electronic component 200) is pressed to be integrated (see FIGS. 6A~10). Then, as shown in FIG. 19A, using a $CO_2$ laser, for example, metal foil 1002 is irradiated from the Z1 side to form holes (1007a, 401a, 402a), and metal foil 1005 is irradiated from the Z2 side to form hole (1007b). Holes (1007a, 1007b) are formed at substantially the same location on the X-Y plane and connected later to become through hole (300a) which penetrates through insulation layers (100a, 100b). When through hole (300a) is formed by a laser, it is preferred that through hole (300a) (in particular hole 1007a) and holes (401a, 402a) be formed simultaneously. However, forming through hole (300a) (in particular hole 1007a) and holes (401a, 402a) is not limited to the above, and they may be formed separately.

The shape of through hole (300a) is an hourglass, corresponding to that of through-hole conductor (300b). The boundary of hole (1007a) and hole (1007b) corresponds to the narrowed portion (300d) (see FIG. 19B). Laser irradiation from the Z1 side and laser irradiation from the Z2 side may be conducted simultaneously or one surface at a time. After through hole (300a) and holes (401a, 402a) are formed, desmearing (cleaning) is preferred to be conducted. Unnecessary conduction (short circuiting) is suppressed by desmearing. Also, to enhance laser absorption efficiency, the surfaces of metal foils (1002, 1005) may be blackened prior to laser irradiation. Through hole (300a) may be formed by other methods such as wet or dry etching instead of using a laser. However, fine processing is easier to achieve by using a laser.

Figure 19B:
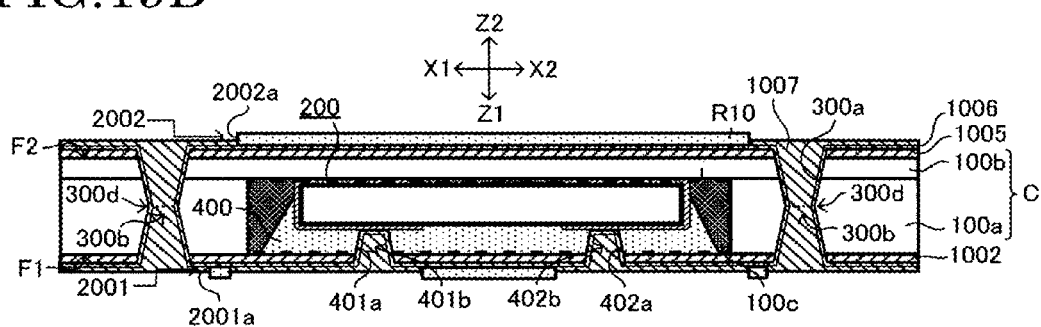
FIG. 19B is a view to illustrate a second step subsequent to the step in FIG. 19A.

Next, using a chemical plating method, for example, electroless copper-plated film 1006, for example, is formed on the laminate surfaces, namely, on metal foils (1002, 1005) and in through hole (300a) and holes (401a, 402a) (see FIG. 19B). A catalyst such as palladium may be adsorbed on surfaces of insulation layers (100a, 100b) through immersion, for example, prior to electroless plating.

Next, using a lithographic technique, printing or the like, plating resist 2001 with opening portion (2001a) is formed on the first-surface (F1) side main surface (on electroless plated film 1006) and plating resist 2002 with opening portion (2002a) is formed on the second-surface (F2) side main surface (on electroless plated film 1006) (see FIG. 16). Opening portions (2001a, 2002a) have patterns corresponding to those of conductive layers (301, 302) respectively (see FIG. 19C).

Next, as shown in FIG. 19B, using a pattern plating method, for example, electrolytic copper plating 1007, for example, is formed in opening portions (2001a, 2002a) of plating resists (2001, 2002). Specifically, copper as the plating material is connected to the anode, and electroless plated film 1006 (seed layer) as the material to be plated is connected to the cathode, then they are immersed in a plating solution. Then, direct current voltage is applied between both poles to flow electricity so that copper is deposited on the surface of electroless plated film 1006. In doing so, electroless plated film 1006 and electrolytic plated film 1007 are filled in through hole (300a), forming through-hole conductor (300b). As a result, core section (C) is formed, having insulation layers (100a, 100b) and through-hole conductor (300b). Also, electroless plated film 1006 and electrolytic plating 1007 are each filled in holes (401a, 402a), forming via conductors (401b, 402b).

Figure 19C:
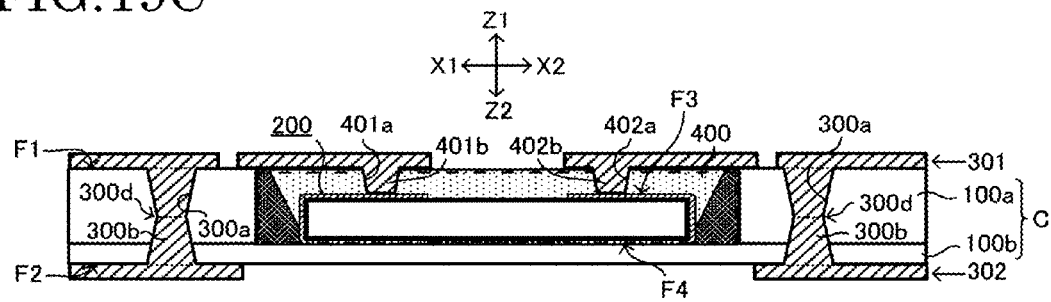
FIG. 19C is a view to illustrate a third step subsequent to the step in FIG. 19B.

After the above, using a predetermined removing solution, for example, plating resists (2001, 2002) are removed, and unnecessary portions of electroless plated film 1006 and metal foils (1002, 1005) are removed. Accordingly, as shown in FIG. 19C, conductive layer 301 is formed on first surface (F1) of core section (C), and conductive layer 302 is formed on second surface (F2) of core section (C). A seed layer for electrolytic plating is not limited to electroless plated film. Instead of electroless plated film 1006, sputtered film or the like may also be used as a seed layer.

Figure 20A:
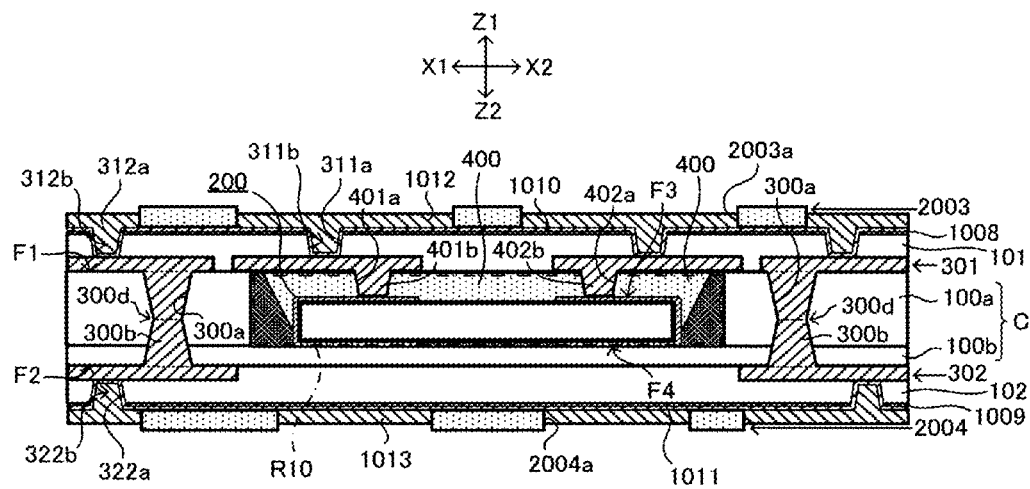
FIG. 20A is a view to illustrate a first step of a method for forming a second conductive layer according to the second embodiment of the present invention.

Next, the same as in the first embodiment, after insulation layers (101, 102), metal foils (1008, 1009) and holes (311a, 312a, 322a) are formed using chemical plating, for example, electroless copper-plated films (1010, 1011), for example, are formed on the laminate surfaces, namely, on metal foils (1008, 1009) and in holes (311a, 312a, 322a) respectively (see FIG. 20A). Here, prior to electroless plating, a catalyst such as palladium may be adsorbed on surfaces of insulation layers (101, 102) through immersion, for example.

Next, using a lithographic technique, printing or the like, plating resist 2003 with opening portion (2003a) is formed on the first-surface (F1) side main surface (on electroless plated film 1010) and plating resist 2004 with opening portion (2004a) is formed on the second-surface (F2) side main surface (on electroless plated film 1011) (see FIG. 20A). Opening portions (2003a, 2004a) have patterns corresponding to those of conductive layers (110, 120) respectively (FIG. 1).

Next, as shown in FIG. 20A, using a pattern plating method, for example, electrolytic copper platings (1012, 1013), for example, are formed in opening portions (2003a, 2004a) of plating resists (2003, 2004) respectively. Specifically, copper as the plating material is connected to the anode, and electroless plated films (1010, 1011) (seed layers) as the material to be plated are connected to the cathode, then they are immersed in a plating solution. Then, direct current voltage is applied between both poles to flow electricity so that copper is deposited on the surfaces of electroless plated films (1010, 1011). In doing so, electrolytic plated films (1012, 1013) are filled in holes (311a, 312a, 322a), forming via conductors (311b, 312b, 322b) made of copper plating, for example.

Figure 20B:
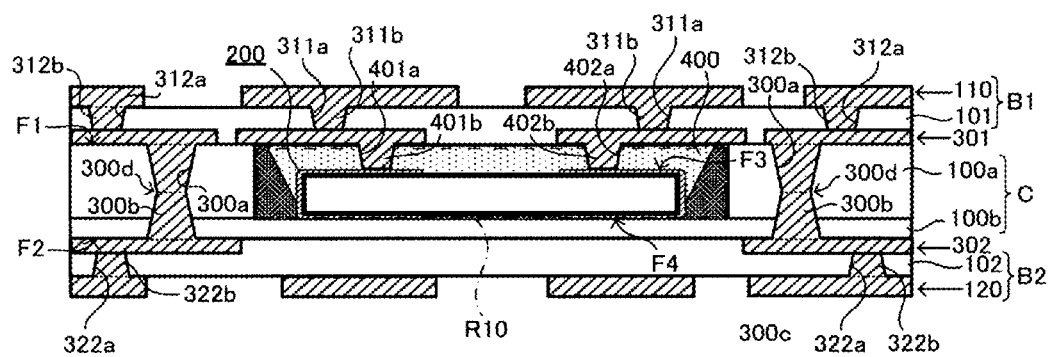
FIG. 20B is a view to illustrate a second step subsequent to the step in FIG. 20A.

After the above, using a predetermined removing solution, for example, plating resists (2003, 2004) are removed, and unnecessary portions of electroless plated films (1010, 1011) and metal foils (1008, 1009) are removed. Accordingly, as shown in FIG. 20B, conductive layers (110, 120) are formed. As a result, first buildup section (B1) formed with insulation layer 101 and conductive layer 110 is formed on first surface (F1) of core section (C), and second buildup section (B2) formed with insulation layer 102 and conductive layer 120 is formed on second surface (F2) of core section (C). A seed layer for electrolytic plating is not limited to electroless plated film. Instead of electroless plated films (1010, 1011), sputtered film or the like may be used as a seed layer.

Wiring board 20 (FIG. 18) is manufactured by the manufacturing method according to the present embodiment. The manufacturing method of the present embodiment is suitable for manufacturing wiring board 20. According to such a manufacturing method, an excellent wiring board 20 is obtained at low cost. Also, regarding the same structure and treatment as those in the first embodiment, substantially the same effects as in the above-described first embodiment are achieved in the present embodiment.

Other Embodiments

Figure 21A:
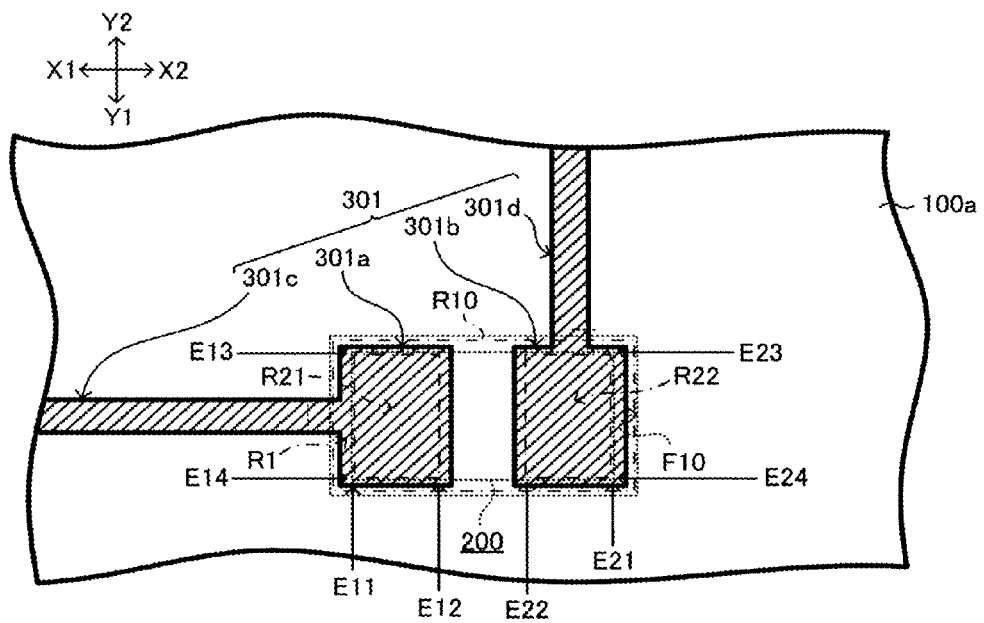
FIG. 21A is a view showing a first alternative example of conductive patterns electrically connected to electrodes of an electronic component by via conductors in the embodiments of the present invention.

As shown in FIG. 21A, three sides of conductive patterns (301a, 301b) may be positioned directly on gap (R1).

Figure 21B:
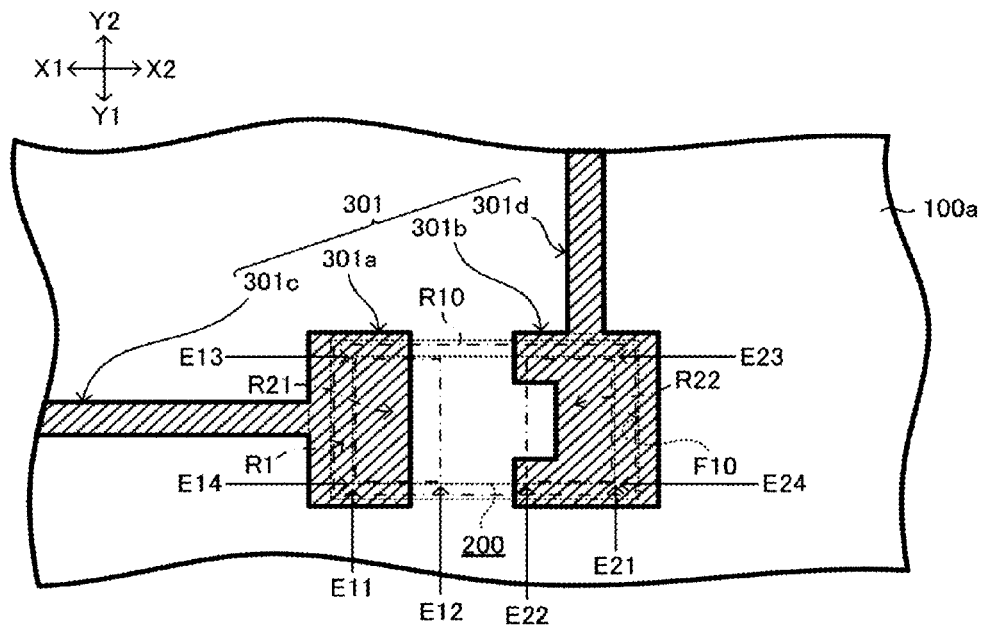
FIG. 21B is a view showing a second alternative example of conductive patterns electrically connected to electrodes of an electronic component by via conductors in the embodiments of the present invention.

It is not always required that planar conductive pattern (301a) or (301b) be positioned directly on all the four sides of electrode 210 or 220 of electronic component 200 and be positioned directly on the entire region of electrode 210 or 220. For example, as shown in FIG. 21B, it is an option that conductive layer 301 does not have a conductive pattern directly on inner end (E12) of electrode 210 (in particular, the entire region from first end (E13) to second end (E14)). Also, it is an option that conductive layer 301 does not have a conductive pattern directly on inner end (E22) of electrode 220 (a partial portion, in particular). If conductive layer 301 has planar conductive pattern (301*a*) or (301*b*) directly on at least part of the outer edge of electrode 210 or 220, then the reliability of electrical connections is enhanced in a wiring board with a built-in electronic component. When forming a planar conductive pattern directly on an outer edge, it is preferred that the planar conductive pattern be formed directly on the outer edge while spanning it.

Figure 22A:
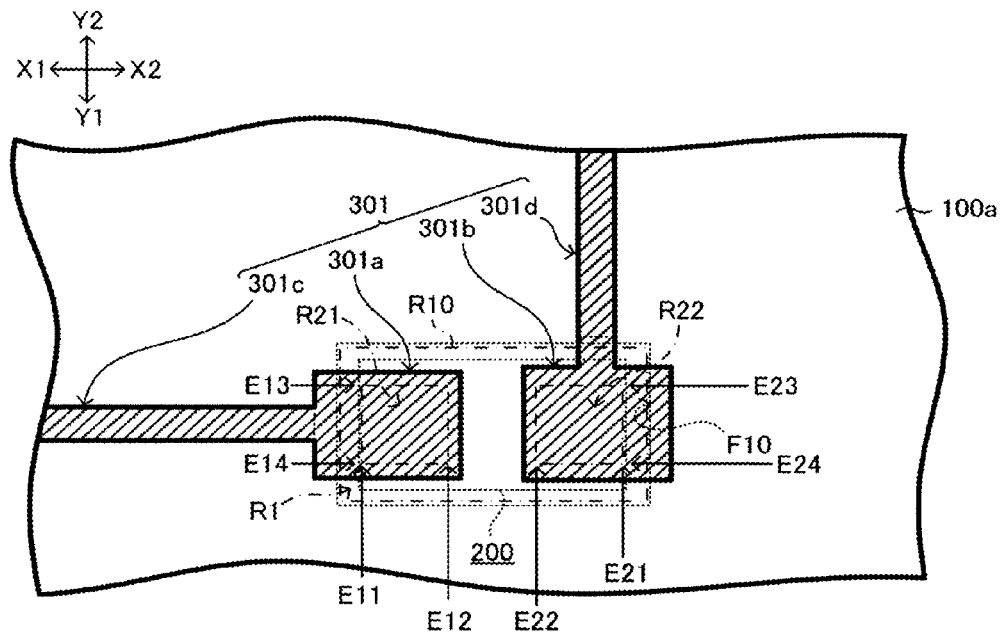
FIG. 22A is a view showing a third alternative example of conductive patterns to be electrically connected to electrodes of an electronic component by via conductors in the embodiments of the present invention.
Figure 22B:
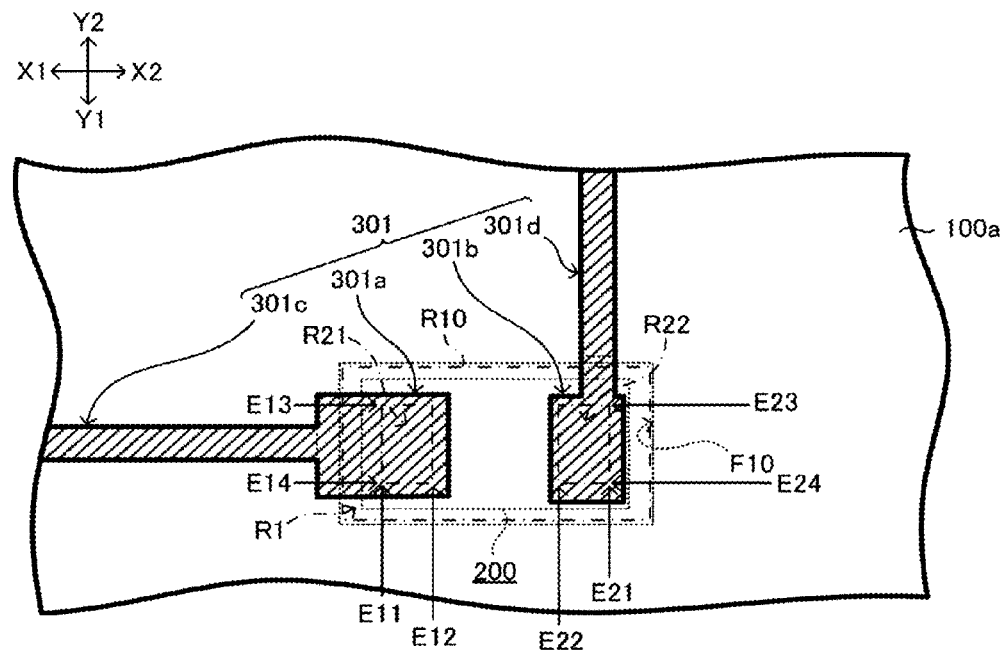
FIG. 22B is a view showing a fourth alternative example of conductive patterns to be electrically connected to electrodes of an electronic component by via conductors in the embodiments of the present invention.

First ends (E13, E23), second ends (E14, E24) and outer ends (E11, E21) are not always required to correspond to the end surfaces of electronic component 200 respectively. For example, as shown in FIG. 22A, first ends (E13, E23) and second ends (E14, E24) may be positioned further inside than the end surfaces of electronic component 200 (directly on electronic component 200). Also, as shown in FIG. 22B, for example, first ends (E13, E23), second ends (E14, E24) and outer ends (E11, E21) may each be positioned further inside than end surfaces of electronic component 200 (directly on electronic component 200) respectively. In any example shown in FIGS. 22A and 22B, outer edges of electrodes (210, 220) (outer ends (E11, E21), first ends (E13, E23) and second ends (E14, E24)) are positioned near the periphery (four sides) of electronic component 200. In such a structure as well, since conductive layer 301 has planar conductive pattern (301*a*) or (301*b*) directly on the outer edge of electrode 210 or 220, damage or the like from etching is suppressed from occurring near the periphery of electronic component 200 where electrode 210 or 220 of electronic component 200 and metal foil 1002 tends to make contact (see FIGS. 7A and 7B).

Figure 23A:
FIG. 23A is a view showing a square as another example of the planar shape of a through-hole conductor, each via conductor or their land in a wiring board in the embodiments of the present invention.
Figure 23B:
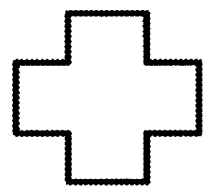
FIG. 23B is a view showing a cross as yet another example of the planar shape of a through-hole conductor, each via conductor or their land in a wiring board in the embodiments of the present invention.
Figure 23C:
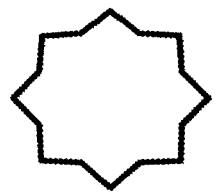
FIG. 23C is a view showing a regular polygonal star as yet another example of the planar shape of a through-hole conductor, each via conductor or their land in a wiring board in the embodiments of the present invention.

The shapes of through-hole conductors, via conductors and their lands in a wiring board are not limited specifically. For example, their planar shapes may be rectangles such as substantially a square as shown in FIG. 23A, or may be a shape formed by drawing straight lines to radiate out from the center (shapes in which multiple spokes are positioned in a radial pattern) such as substantially a cross or substantially a regular polygonal star as shown in FIG. 23B or 23C, for example. Other than those, their planar shapes may be substantially a perfect circle, substantially an ellipse, or substantially a triangle. The shapes of the angles of polygons are not limited specifically, and they may be substantially a right angle, an acute angle or an obtuse angle, for example, or they may also be roundish.

Figure 24:
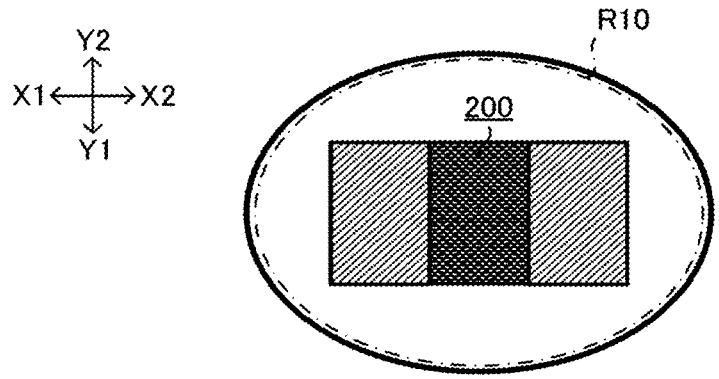
FIG. 24 is a view showing another example of the shapes of an electronic component and a cavity in the embodiments of the present invention.

The shapes of electronic component 200 and cavity (R10) are not limited specifically. For example, as shown in FIG. 24, the opening shape of cavity (R10) may be substantially an ellipse. The shape of the main surfaces of electronic component 200 and the opening shape of cavity (R10) may each be substantially a perfect circle. Alternatively, the shapes may each be substantially a polygon other than substantially a rectangle, such as substantially a square, substantially a hexagon and substantially an octagon. The shapes of the angles of such polygons may be substantially a right angle, an acute angle or an obtuse angle, for example, or they may also be roundish.

In each of the above embodiments, the shape of the main surfaces of electronic component 200 is substantially a rectangle (D11>D12). Electrodes (210, 220) are arrayed along a longitudinal direction of electronic component 200 (see FIG. 3). However, the shape of the main surfaces of electronic component 200 is not limited to such, and it may be a square (D11=D12), for example.

Each of the above embodiments showed wiring board 10 having only one electronic component 200 in cavity (R10) (the accommodation space for electronic component 200). However, wiring board 10 is not limited to such. For example, it may be a wiring board having multiple electronic components 200 in cavity (R10). Multiple electronic components 200 may be arrayed along a lamination direction (a direction Z) or may be arrayed along a direction X or a direction Y. Alternatively, multiple cavities (R10) may be formed in a wiring board.

Figure 25:
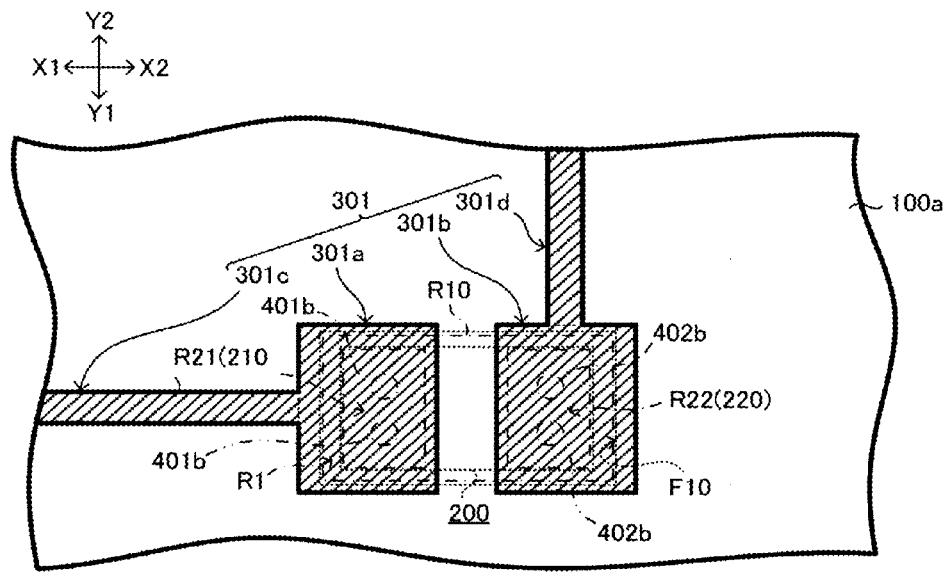
FIG. 25 is a view showing another example in which the number of via conductors to be electrically connected to electrodes of an electronic component (capacitor) is modified in the embodiments of the present invention.

Each of the above embodiments showed an example in which one each of via conductors (401*b*, 402*b*) are respectively connected to electrodes (210, 220) of electronic component 200. However, the number of via conductors (401*b*, 402*b*) is not limited specifically. For example, as shown in FIG. 25, an electrode (electrode 210 or 220) of electronic component 200 may be connected to the land of a via conductor (conductive pattern (301*a*) or (301*b*)) by means of multiple (such as two) via conductors (via conductor (401*b*) or (402*b*)). In such a case, electrode: via conductor: via land=1: multiple: 1 is satisfied.

Each of the above embodiments showed a double-sided wiring board (wiring board 10) having conductive layers on both sides of core section (C). However, the wiring board is not limited to such, and it may be a single-sided wiring board having first buildup section (B1) (including conductive layer 110) only on one side of core section (C) (such as insulative substrate 100) as shown in FIG. 26, for example.

In each of the above embodiments, core section (C) has a double-layer structure of insulation layers (100*a*, 100*b*). However, core section (C) is not limited to such, and it may be structured with one substrate as shown in FIG. 26, for example.

Figure 26:
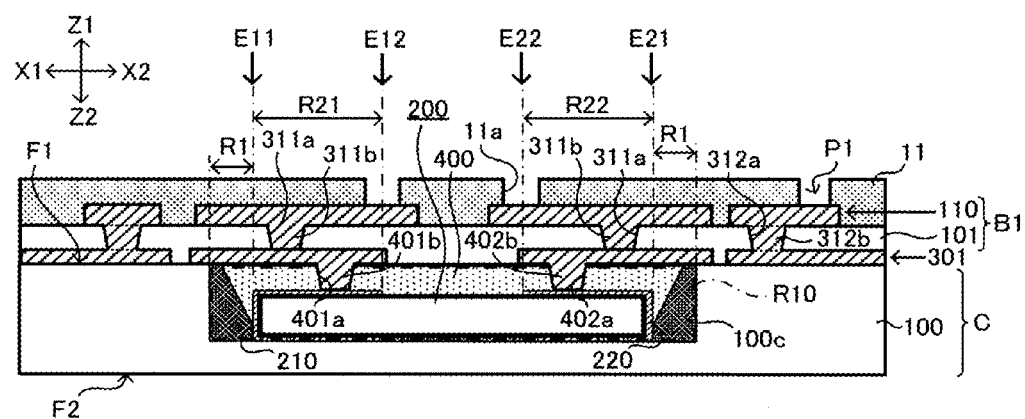
FIG. 26 is a view showing a single-sided wiring board in another embodiment of the present invention.

For example, as shown in FIG. 26, cavity (R10) (the accommodation space for electronic component 200) may be a hole (recessed portion) that does not penetrate through substrate 100.

Each of the above embodiments showed wiring board 10 with first buildup section (B1) and second buildup section (B2) each having one layer on both sides of core section (C). However, wiring board 10 is not limited to such, and it may have a buildup section having two or more layers on one side of core section (C).

Figure 27:
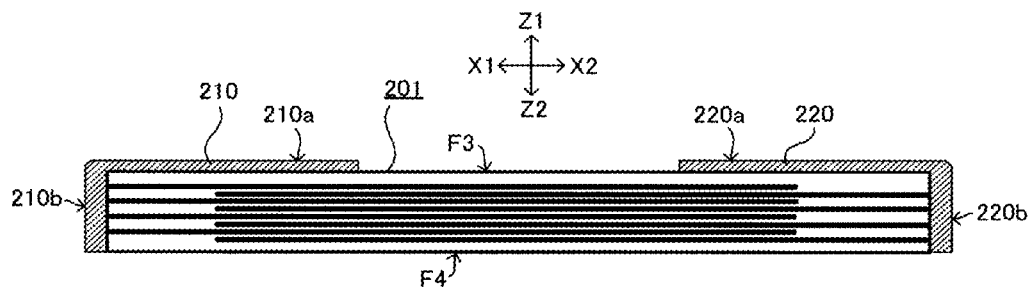
FIG. 27 is a view showing a first alternative example of an electronic component the embodiments of the present invention.
Figure 28:
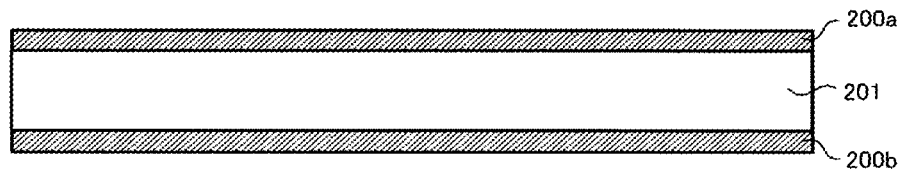
FIG. 28 is a view showing a second alternative example of an electronic component in the embodiments of the present invention.

The shape of the electrodes of electronic component 200 is not limited to a U-shape. For example, as shown in FIG. 27, it may be an L-shape without lower portions (210*c*, 220*c*) (or upper portions (210*a*, 220*a*)) of electrodes (210, 220) in each embodiment. Alternatively, they may be a pair of flat-plate electrodes (electrodes (200*a*, 200*b*)) to sandwich capacitor body 201 as shown in FIG. 28, for example.

Figure 29:
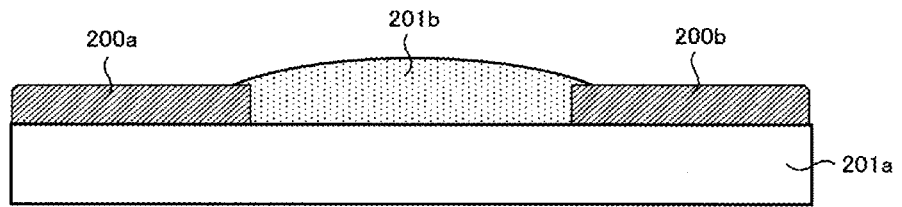
FIG. 29 is a view showing a third alternative example of an electronic component in the embodiments of the present invention.

The kind of electronic component 200 is not limited to an MLCC, but may be any other kind. Electronic component 200 is not limited to a capacitor, and it may be a chip resistor as shown in FIG. 29, for example. The chip resistor shown in FIG. 29 has substrate (201*a*), and further contains electrode (200*a*), resistor section (201*b*) and electrode (200*b*) on substrate (201*a*). Electronic component 200 is not limited to a passive component, and it may be an active component formed with an IC (integrated circuit) or the like.

The structure of wiring board 10, as well as the type, performance, measurement, quality, shape, number of layers, positioning and so forth of the elements of such a structure, may be modified freely within a scope that does not deviate from the gist of the present invention.

Figure 30:
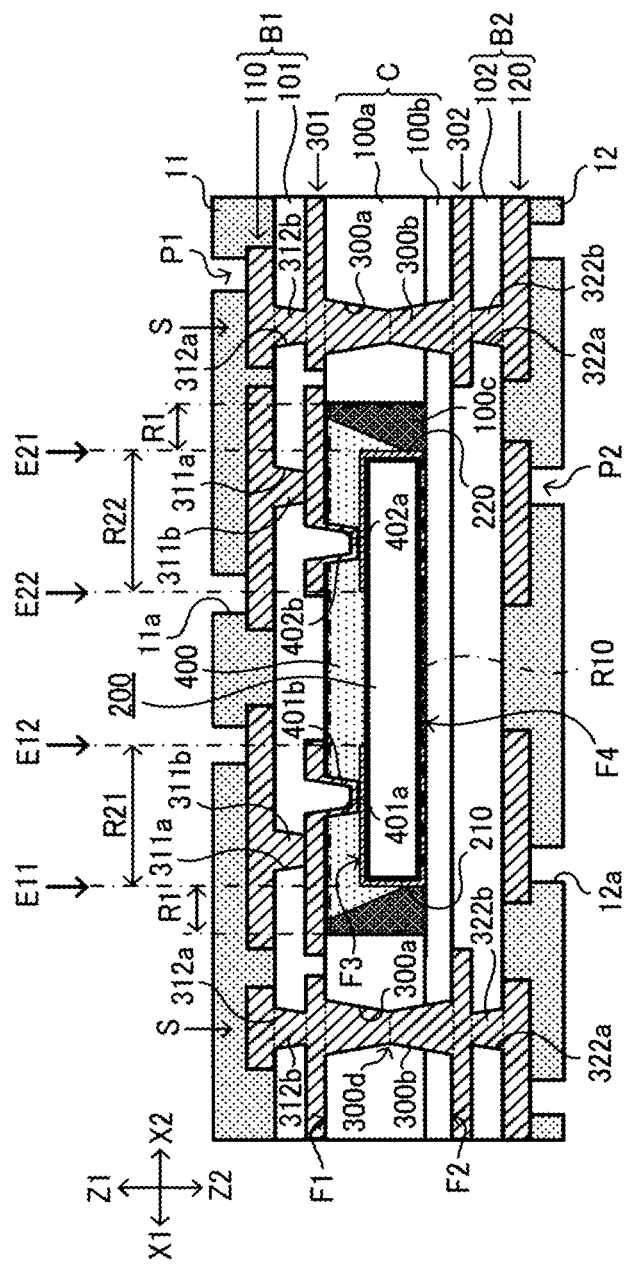
FIG. 30 is a view showing a wiring board with a built-in electronic component in which via conductors electrically connected to electrodes of an electronic component are conformal conductors in yet another embodiment of the present invention.

For example, a through-hole conductor or each via conductor in a wiring board is not limited to a filled conductor, and it may be a conformal conductor, for example. Via conductors (401b, 402b) may be conformal conductors as shown in FIG. 30, for example.

The manufacturing process of the wiring board is not limited to the order and contents shown in FIG. 5. The order and contents may be modified freely within a scope that does not deviate from the gist of the present invention. Also, some processes may be omitted depending on usage requirements or the like.

In each of the above embodiments, adhesive layer 400 is formed on carrier 1001 (support material) and then electronic component 200 is arranged on adhesive layer 400 (see FIGS. 6C and 6D). However, the present invention is not limited to such, and electronic component 200 with adhesive layer 400 applied thereon may be arranged on carrier 1001 (support material).

The method for forming each conductive layer of wiring board 10 is not limited specifically. For example, conductive layers may be formed by any one of the following methods or any combination of two or more methods: panel plating, pattern plating, full additive, semi-additive, subtractive, transferring and tenting methods.

Also, instead of using a laser, wet or dry etching may be used for processing. When processing by etching, the areas not required to be removed are preferred to be protected in advance with resist or the like.

Each of the above embodiments, modified examples or the like may be combined freely. It is preferable to select an appropriate combination according to usage requirements or the like. For example, any structure shown in FIGS. 21A~22B may be applied to any structure shown in FIGS. 23A~30.

A wiring board with a built-in electronic component according to an embodiment of the present invention includes the following: a substrate having an accommodation section; an electronic component with an electrode accommodated in the accommodation section; an insulation layer formed on the electronic component; a via conductor made by forming a conductor in a via hole formed in the insulation layer; and a conductive layer electrically connected to the electrode by the via conductor. In such a wiring board with a built-in electronic component, the conductive layer has a planar conductive pattern directly on at least one outer edge of the electrode.

A method for manufacturing a wiring board with a built-in electronic component according to an embodiment of the present invention includes the following: preparing an electronic component having an electrode; forming an insulation layer on the electronic component; forming a via hole in the insulation layer; forming a via conductor in the via hole; and directly on the outer edge of the electrode, forming a planar conductive pattern at least one portion of which is electrically connected to the electrode by the via conductor.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
a substrate having an accommodation portion;
an electronic component having an electrode and accommodated in the accommodation portion of the substrate;
an adhesive layer formed in the accommodation portion of the substrate such that the adhesive layer is positioning the electronic component in the accommodation portion of the substrate;
a conductive layer having a wiring conductive pattern and a planar conductive pattern formed directly on a surface of the substrate such that the planar conductive pattern is formed directly on a surface of the adhesive layer and extending over the electrode of the electronic component; and
at least one via conductor formed in the adhesive layer such that the via conductor is connecting the planar conductive pattern of the conductive layer and the electrode of the electronic component,
wherein the conductive layer is formed such that the wiring conductive pattern and the planar conductive pattern have a same thickness, the electrode of the electronic component has a portion which faces the planar conductive pattern of the conductive layer and which has a plurality of outer edges facing outward with respect to a surface of the electronic component on which the portion of the electrode is formed, and the planar conductive pattern of the conductive layer has a portion positioned directly over at least one of the outer edges of the electrode of the electronic component.

2. The wiring board with a built-in electronic component according to claim 1, wherein the portion of the planar conductive pattern is positioned directly over the at least one of the outer edges of the electrode and over a periphery portion of the electronic component.

3. The wiring board with a built-in electronic component according to claim 1, wherein the planar conductive pattern of the conductive layer is a land portion of the via conductor.

4. The wiring board with a built-in electronic component according to claim 1, wherein the electrode of the electronic component is a first electrode formed on one end portion of the electronic component, and the electronic component has a second electrode on an opposite end portion of the electronic component.

5. The wiring board with a built-in electronic component according to claim 4, wherein the first electrode and the second electrode are arrayed along a longitudinal direction of the electronic component.

6. The wiring board with a built-in electronic component according to claim 4, wherein the planar conductive pattern of the conductive layer is formed in a region which extends at least 50 μm from the one end portion toward an inner side with respect to the surface of the electronic component.

7. The wiring board with a built-in electronic component according to claim 1, wherein the planar conductive pattern of the conductive layer is formed directly over an entire surface of the portion of the electrode.

8. The wiring board with a built-in electronic component according to claim 1, wherein the electrode of the electronic component is configured such that the electrode extends from a first surface of the electronic component to a second surface of the electronic component on an opposite side of the first surface of the electronic component through a side of the electronic component connecting the first surface and second surface of the electronic component.

9. The wiring board with a built-in electronic component according to claim 3, wherein the electrode is connected to the land portion of the via conductor through a plurality of via conductors.

10. The wiring board with a built-in electronic component according to claim 1, wherein the via conductor is formed over the electronic component, and the adhesive layer is made of an insulative adhesive material.

11. The wiring board with a built-in electronic component according to claim 1, wherein the electronic component is a capacitor.

12. The wiring board with a built-in electronic component according to claim 1, wherein the planar conductive pattern is patterned by etching.

13. The wiring board with a built-in electronic component according to claim 1, wherein the planar conductive pattern includes a metal foil.

14. The wiring board with a built-in electronic component according to claim 1, wherein the substrate forms a core portion of the wiring board, and the accommodation portion of the substrate is an opening portion formed in the core portion of the wiring board.

15. The wiring board with a built-in electronic component according to claim 14, wherein the via conductor is formed over the electronic component, and the adhesive layer forms a portion of the core portion of the wiring board.

16. The wiring board with a built-in electronic component according to claim 15, wherein the conductive layer is formed on the core portion of the wiring board.

17. A method for manufacturing a wiring board with a built-in electronic component, comprising:
    forming an adhesive layer on an electronic component having an electrode such that the adhesive layer covers the electrode of the electronic component;
    forming a via hole in the adhesive layer such that the via hole extends to the electrode of the electronic component;
    forming a via conductor in the via hole such that the via conductor is connected to the electrode of the electronic component; and
    forming directly on a surface of the adhesive layer a conductive layer having a wiring conductive pattern and a planar conductive pattern such that the planar conductive pattern is formed on the adhesive layer and extends over the electrode of the electronic component,
    wherein the conductive layer is formed such that the wiring conductive pattern and the planar conductive pattern have a same thickness, the electrode of the electronic component has a portion which faces the planar conductive pattern of the conductive layer and which has a plurality of outer edges facing outward with respect to a surface of the electronic component on which the portion of the electrode is formed, and the planar conductive pattern of the conductive layer has a portion positioned directly over at least one of the outer edges of the electrode of the electronic component.

18. The method for manufacturing a wiring board with a built-in electronic component according to claim 17, wherein the planar conductive pattern is formed by a subtractive method.

19. The method for manufacturing a wiring board with a built-in electronic component according to claim 17, wherein the forming of the adhesive layer includes preparing a support material having a conductive film at least on one surface of the support material, fixing the electronic component on the conductive film using an insulative adhesive layer, preparing an insulative substrate having an opening portion, positioning in the opening portion of the insulative substrate the electronic component fixed by the adhesive layer comprising the insulative adhesive layer, and removing the support material from the electronic component.

20. The method for manufacturing a wiring board with a built-in electronic component according to claim 17, wherein the electronic component is a capacitor.

* * * * *